US011038477B2

(12) United States Patent
Raymond et al.

(10) Patent No.: US 11,038,477 B2
(45) Date of Patent: Jun. 15, 2021

(54) HIGH GAIN RESONANT AMPLIFIER FOR RESISTIVE OUTPUT IMPEDANCE

(71) Applicant: Airity Technologies, LLC, Redwood City, CA (US)

(72) Inventors: Luke Christopher Raymond, Redwood City, CA (US); Johan Oscar Lennart Andreasson, Redwood City, CA (US); Wei Liang, Palo Alto, CA (US)

(73) Assignee: Airity Technologies, LLC, Redwood City, CA (US)

( * ) Notice: Subject to any disclaimer, the term of this patent is extended or adjusted under 35 U.S.C. 154(b) by 0 days.

(21) Appl. No.: 16/024,703

(22) Filed: Jun. 29, 2018

(65) Prior Publication Data
US 2019/0007004 A1 Jan. 3, 2019

Related U.S. Application Data

(60) Provisional application No. 62/527,348, filed on Jun. 30, 2017.

(51) Int. Cl.
*H03F 3/217* (2006.01)
*H03F 1/56* (2006.01)
(Continued)

(52) U.S. Cl.
CPC ........... *H03F 1/565* (2013.01); *H03F 1/0205* (2013.01); *H03F 3/193* (2013.01); *H03F 3/195* (2013.01);
(Continued)

(58) Field of Classification Search
CPC ........ H03F 1/565; H03F 3/211; H03F 3/2178; H03F 3/2173; H03F 3/193; H03F 1/0205;
(Continued)

(56) References Cited

U.S. PATENT DOCUMENTS 4,553,199 A * 11/1985 Harada ............... H02M 3/3372
363/24
6,469,919 B1 10/2002 Bennett
(Continued)

FOREIGN PATENT DOCUMENTS

| CN | 104901630 A | 9/2015 |
|---|---|---|
| EP | 1603231 | 12/2005 |
| WO | WO 2010033727 | 3/2010 |

OTHER PUBLICATIONS

"Coil Design for Induction Cooking System." Electrical Engineering Stack Exchange, Oct. 2, 2015, (4 pages), electronics.stackexchange.com/questions/193125/coil-design-for-induction-cooking-system.
(Continued)

*Primary Examiner* — Khanh V Nguyen
(74) *Attorney, Agent, or Firm* — Mintz Levin Cohn Ferris Glovsky and Popeo, P.C.

(57) ABSTRACT

In some implementations, there is provided an apparatus comprising a resonant amplifier circuit including a first inductor having a first inductive input and a first inductive output; a second inductor having a second inductive input and a second inductive output; a first switch coupled to the first inductive output; and a second switch coupled to the second inductive output, wherein the first switch and the second switched are driven out of phase, wherein the first inductor is configured to be resonant with a first capacitance associated with the first switch, and wherein the second inductor is configured to be resonant with a second capacitance associated with the second switch. Related systems and articles of manufacture are also provided.

20 Claims, 24 Drawing Sheets
(23 of 24 Drawing Sheet(s) Filed in Color)

(51) Int. Cl.
*H03F 3/193* (2006.01)
*H03F 1/02* (2006.01)
*H03F 3/195* (2006.01)
*H03F 3/21* (2006.01)
*H03F 3/213* (2006.01)
*H02M 7/538* (2007.01)
*H01J 37/32* (2006.01)

(52) U.S. Cl.
CPC .............. *H03F 3/211* (2013.01); *H03F 3/213* (2013.01); *H03F 3/2173* (2013.01); *H03F 3/2176* (2013.01); *H03F 3/2178* (2013.01); *H01J 37/321* (2013.01); *H01J 37/32183* (2013.01); *H02M 7/538* (2013.01); *H03F 2200/297* (2013.01); *H03F 2200/301* (2013.01); *H03F 2200/387* (2013.01); *H03F 2200/451* (2013.01)

(58) Field of Classification Search
CPC ........ H03F 3/195; H03F 3/2176; H03F 3/213; H03F 2200/451; H03F 2200/297; H03F 2200/301; H03F 2200/387; H01J 37/321; H01J 37/32183; H02M 7/538
USPC .............................................. 330/207 A, 251
See application file for complete search history.

(56) References Cited

U.S. PATENT DOCUMENTS

| | | | |
|---|---|---|---|
| 7,397,676 B2* | 7/2008 | Lincoln | H02H 7/122 363/56.01 |
| 7,512,422 B2 | 3/2009 | Coleman | |
| 7,872,523 B2* | 1/2011 | Sivakumar | H03F 3/2176 330/10 |
| 7,880,549 B1* | 2/2011 | Tserng | H03F 3/245 330/303 |
| 7,999,621 B2* | 8/2011 | Hajimiri | H03F 1/0211 330/146 |
| 8,058,927 B2 | 11/2011 | Potscher et al. | |
| 8,643,326 B2 | 2/2014 | Campanella et al. | |
| 9,425,653 B2* | 8/2016 | Cook | H02J 50/10 |
| 9,590,565 B2* | 3/2017 | Yuzurihara | H03F 1/086 |
| 9,748,864 B2* | 8/2017 | Luu | H02M 7/5387 |
| 10,020,747 B2* | 7/2018 | Madsen | H02M 1/14 |
| 2005/0088231 A1 | 4/2005 | Ziegler | |
| 2009/0154544 A1 | 6/2009 | Potscher | |
| 2015/0381057 A1 | 12/2015 | Luu | |
| 2017/0085189 A1 | 3/2017 | Madsen | |

OTHER PUBLICATIONS

"How to Calculate Value of Capacitor and Inductor in a High Power LC Circuit?" Electrical Engineering Stack Exchange, Oct. 7, 2012, (2 pages), electronics.stackexchange.com/questions/43019/how-to-calculate-value-of-capacitor-and-inductor-in-a-high-power-lc-circuit.
Power Guru, "The Half-Bridge Circuit Revealed," Aug. 30, 2012, (6 pages), http://archive.li/1AvbX.
Roon, Tony van. Transistor Tutorial: Power Amplifiers, Part 4, Dec. 18, 2009, (8 pages), www.learningelectronics.net/VA3AVR/tutorial/xtor/xtor4/xtor4.html.
European Patent Office, International Search Report and Written Opinion for PCT/US2018/040498, dated Oct. 8, 2018, 15 pages.

* cited by examiner

HIGH GAIN RESONANT AMPLIFIER FOR RESISTIVE OUTPUT IMPEDANCE

CROSS-REFERENCE TO RELATED APPLICATIONS

This application claims the benefit of U.S. provisional patent application Ser. No. 62/527,348, filed on Jun. 30, 2017, and entitled "HIGH GAIN RESONANT AMPLIFIER FOR RESISTIVE OUTPUT IMPEDANCE," which is incorporated by reference herein in its entirety.

TECHNICAL FIELD

The subject matter described herein relates generally to resonant amplifiers.

BACKGROUND

High performance, high voltage (HV) radio frequency (RF) amplifiers are often large, heavy, inefficient, and require additional components to match the output to their loads. The high performance, high voltage RF amplifiers may include heavy cables that transmit the power and expensive matching networks that adjust the output impedance to a given impedance.

SUMMARY

In some implementations, there is provided an apparatus comprising a resonant amplifier circuit including a first inductor having a first inductive input and a first inductive output; a second inductor having a second inductive input and a second inductive output; a first switch coupled to the first inductive output; and a second switch coupled to the second inductive output, wherein the first switch and the second switched are driven out of phase, wherein the first inductor is configured to be resonant with a first capacitance associated with the first switch, and wherein the second inductor is configured to be resonant with a second capacitance associated with the second switch.

In some variations, one or more features disclosed herein including the following features can optionally be included in any feasible combination. The first terminal of the first switch and a first terminal of the second switch are coupled to a power source. A power source may have a first output and a second output. The first output comprises a negative output of the power source, wherein the second output comprises a positive output of the power source, wherein the positive output is coupled in parallel to the first inductive input and the second inductive input. The negative source output is coupled in parallel to a first terminal of the first switch and a first terminal of the second switch. The first inductive output is coupled in parallel to a second terminal of the first switch and a first external capacitance. The second inductive output is coupled in parallel to a second terminal of the second switch and a second external capacitance. The negative source output is further coupled in parallel to a first external capacitance and/or a second external capacitance. The first capacitance comprises a first capacitance value across a first terminal and a second terminal of the first switch, and wherein the second capacitance comprises a second capacitance value across a first terminal and a second terminal of the second switch. The first capacitance comprises an intrinsic capacitance of the first switch, and wherein the second switch capacitance comprises an intrinsic capacitance of the second switch. The intrinsic capacitance is a drain-to-source capacitance for the first switch and a gate-to-drain capacitance for the first switch. The first capacitance further comprises a first external capacitance, and/or wherein the second capacitance further comprises a second external capacitance. The first switch and the second switch each comprise a field-effect transistor. The first switch and the second switch each comprise a high-electron-mobility transistor (HEMT), a gallium nitride (GaN) HEMT, a gallium arsenide (GaAs) HEMT, a bipolar junction transistor (BJT), an insulated-gate bipolar transistor (IGBT), a junction gate field-effect transistor, a thyristor, a metal-oxide-semiconductor field-effect transistor (MOSFET), a silicon carbide (SiC) (MOSFET), a silicon (Si) (MOSFET), a diode, and/or a silicon-controlled rectifier. A load may be coupled across the first switch and the second switch. The load comprises a plurality of loads, and wherein an output of the power source is coupled to at least a portion of the plurality of loads. A load matching circuit may be coupled to the first inductive output and the second inductive output. The load matching circuit is further coupled to at least one blocking capacitor. The load matching circuit comprises at least one inductor, at least one capacitor, and/or at least one transformer. A rectifier circuit may be configured to provide a direct current output to a load. A first blocking capacitor may have a first blocking input and a first blocking output, and wherein the first blocking input is coupled to at least the first switch and the first blocking output is coupled to a load. A second blocking capacitor may have a second blocking input and a second blocking output, and wherein the second blocking input is coupled to at least the second switch and the second blocking output is coupled to the load. The first inductor and/or the second inductor each comprise a transformer. The first switch and the second switched are driven out of phase by 180 degrees. The resonant amplifier circuit comprises an array of resonant amplifier circuits connected in parallel and/or series. The first switch comprises a plurality of first switches. The plurality of first switches share a common clock configured to turn the plurality of first switches on and/or off at a same time. The second switch comprises a plurality of second switches. The plurality of second switches share a common clock configured to turn the plurality of second switches on and/or off at a same time. The first switch comprises a plurality of first switches, wherein the second switch comprises a plurality of second switches. One of the switches of the plurality of first switches and another switch in the plurality of second switches share an interval, wherein during a first portion of the interval the one of the switches of the plurality of first switches is gated to turn on and off and then during a second portion of the interval the other switch in the plurality of second switches is gated to turn on and off.

Implementations of the current subject matter can include, but are not limited to, methods consistent with the descriptions provided herein as well as articles that comprise a tangibly embodied machine-readable medium operable to cause one or more machines (e.g., computers, etc.) to result in operations implementing one or more of the described features.

The details of one or more variations of the subject matter described herein are set forth in the accompanying drawings and the description below. Other features and advantages of the subject matter described herein will be apparent from the description and drawings, and from the claims. While certain features of the currently disclosed subject matter are described for illustrative purposes in relation to web application user interfaces, it should be readily understood that such features are not intended to be limiting. The claims that follow this disclosure are intended to define the scope of the protected subject matter.

DESCRIPTION OF DRAWINGS

The patent or application file contains at least one drawing executed in color. Copies of this patent or patent application publication with color drawing(s) will be provided by the Office upon request and payment of the necessary fee. The accompanying drawings, which are incorporated in and constitute a part of this specification, show certain aspects of the subject matter disclosed herein and, together with the description, help explain some of the principles associated with the disclosed implementations. In the drawings.

When practical, similar reference numbers denote similar structures, features, or elements.

DETAILED DESCRIPTION

Figure 1A:
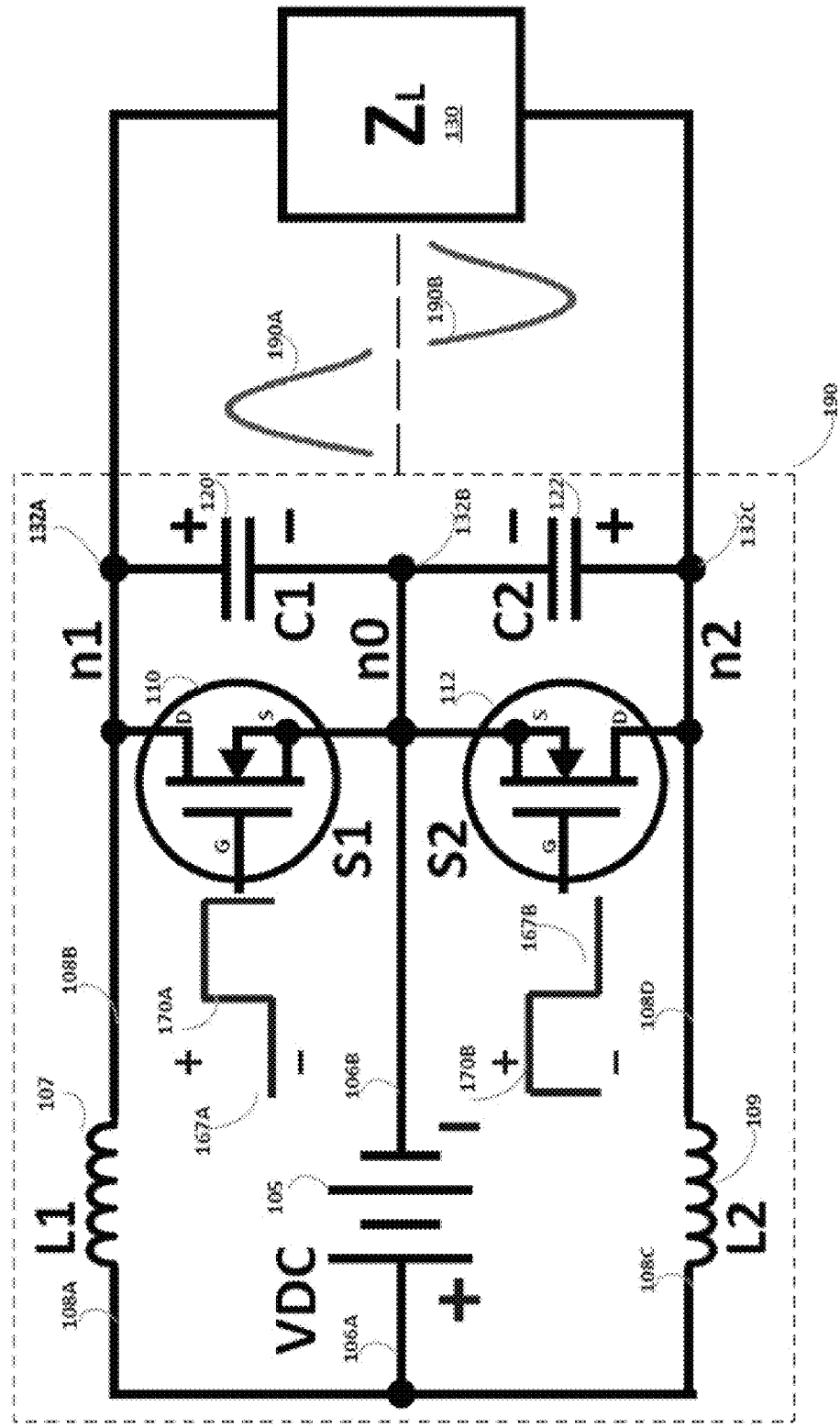
FIG. 1A-FIG. 1E depict examples of resonant amplifier circuits, in accordance with some example embodiments.

As noted, high performance, high voltage RF amplifiers are often large, heavy, inefficient, and often require additional matching components. As such, there is a need for new RF amplifier technology that can reduce size and complexity of these high voltage RF amplifiers and thus can yield simpler, lower cost devices having improved efficiency and performance. This new amplifier technology, as disclosed herein, may enable a variety of applications for RF amplifier technology requiring a small format, which may enable the technology to be placed in proximity to the load. This may, in some implementations, enable eliminating matching networks and/or high voltage/power cables, which may lead to additional savings with respect to costs and power losses. Some of the applications include, for example, arrays of RF sources that can work in parallel, but can be individually tuned in terms of voltage, frequency, phase, and pulsed operation to improve the control and tuning, which may lead to improved accuracy and better process control.

In some example embodiments, there is provided an HV RF amplifier technology including a circuit topology that is amenable to small printed circuit board (PCB) implementations and that enables small, efficient, and cost-effective RF power sources to be constructed that can be used over a wide range of operational parameters, such as voltage, frequency, power, and load.

Conventional resonant amplifiers, such as class E amplifiers, may require multiple large-value inductive elements, such as inductors, transformers, and/or the like, to achieve proper resonant operation. Furthermore, an inductive load tank circuit may be used to help shape the resonant output waveforms of the power semiconductors for efficient operation, especially in the radio frequency range. Inductive elements may be physically large and may attenuate the fundamental gain of the circuit.

In some example embodiments, there is provided an amplifier circuit, such as a resonant amplifier circuit (which may be tuned as described herein). In some example embodiments, the HV resonant amplifier circuit may operate at high voltages (e.g., 5 kilovolts (kV)) and at high frequencies (e.g., RF frequencies), and may be configured to provide resonant operation, without relying on inductive elements in the load line of the circuit. By relying primarily on the relationship between the input inductors ($L_1$ and $L_2$) and the device capacitance ($C_1$ and $C_2$, including any extra added capacitance), the gain of the fundamental frequency may be maximized into the load with a relatively minimal harmonic content before any low pass filtering or matching networks.

The relatively small value of $L_1$ and $L_2$ may enable the inductors to be sufficiently small in physical size to be implemented in air core and/or a printed circuit board (PCB) using the metal traces and vias in certain patterns at frequencies, such as RF frequencies (e.g., 20 Kilohertz to 300 Gigahertz), and frequencies above 1 MHz, for example.

FIG. 1A depicts an example of an amplifier circuit, such as a resonant amplifier circuit 100, in accordance with some example embodiments.

The circuit 100 may include a power source, such as a direct current (DC) power source 105, a first inductor 107, a second inductor 109, a first switch 110, a second switch 112, a first capacitor 120, a second capacitor 122, and a load, such as an impedance load ($Z_L$) 130, a resistive load, and/or the like. Although FIG. 1 depicts a DC power source, other types of power sources may be used as well.

The positive output 106A of the direct current power source 105 may be coupled in parallel to an input 108A (e.g., a terminal, contact, and/or the like) of a first inductor ($L_1$) 107 and to an input 108C of a second inductor ($L_2$) 109.

The negative output 106B of the power source 105 may be coupled in parallel to node n0 132B, which is further coupled in parallel to a source (labeled "S") terminal of a first switch 110, a source (labeled "S") terminal of the second switch 112, a negative (or cathode labeled "−") input of the capacitor 120, and the negative input of the second capacitor 122.

The output 108B of the first inductor 107 may be coupled to node n1 132A, which is further coupled in parallel to a terminal (labeled "D") of the first switch 110, a positive input (or anode labeled +) of the first capacitor (C1) 120, and the load 130. In the case of a metal-oxide-semiconductor field-effect transistors (MOSFET) for example, the terminal labeled "D" would be a drain.

The output 108D of the second inductor 109 may be coupled to node n2 132C, which is further coupled in parallel to a terminal (labeled "D") of the second switch 112, a positive input of the second capacitor ($C_2$) 122, and the load 130. The terminal "D" may be a drain terminal for the switch 112, when the switch is implemented as a MOSFET, for example.

In some example embodiments, the first switch 110 and the second switch 112 may be implemented as semiconductor devices operating as switches which may be externally controlled (see, e.g., 191 at switches 111 and 113). Alternatively or additionally, the switches 110 and 112 may be implemented using technologies, such as a high-electron-mobility transistor (HEMT), a gallium nitride (GaN) HEMT, a gallium arsenide (GaAs) HEMT, a bipolar junction transistor (BJT), an insulated-gate bipolar transistor (IGBT), a junction gate field-effect transistor, a thyristor, a metal-oxide-semiconductor field-effect transistor (MOSFET), a silicon carbide (SiC) (MOSFET), a silicon (Si) (MOSFET), a diode, and/or a silicon-controlled rectifier, and/or the like depending on the application. The switches 110 and 112 may also be implemented as a combination of two or more combined devices, for example a MOSFET and diodes for a bi-directional switch.

In the example given, the MOSFET includes a gate terminal (labeled "G"), a drain terminal (labeled "D") and a source terminal (labeled "S"). As used herein the term "gate" may be used to also include other similar types of terminals including a "base" terminal used in other technologies. Likewise, the term "source", as used herein, may be used to also include other similar types of terminals including a "collector" terminal used in other technologies. And, the term "drain" may be used to also include other similar types of terminals including an "emitter" terminal used in other technologies.

Although some of the examples described herein refer to NPN type devices, it can be appreciated that PNP type devices can be used as well with the appropriate changes in polarity.

Although FIG. 1A depicts a single load 130, the load may comprise a plurality of loads as well. For example, a first load may be placed across nodes n1 132A and n0 132B (in this example the output of the power source 105 would couple to node n0 and a portion of the load) and a second load may be placed across nodes n0 a 132B and node n2 132C.

Figure 1B:
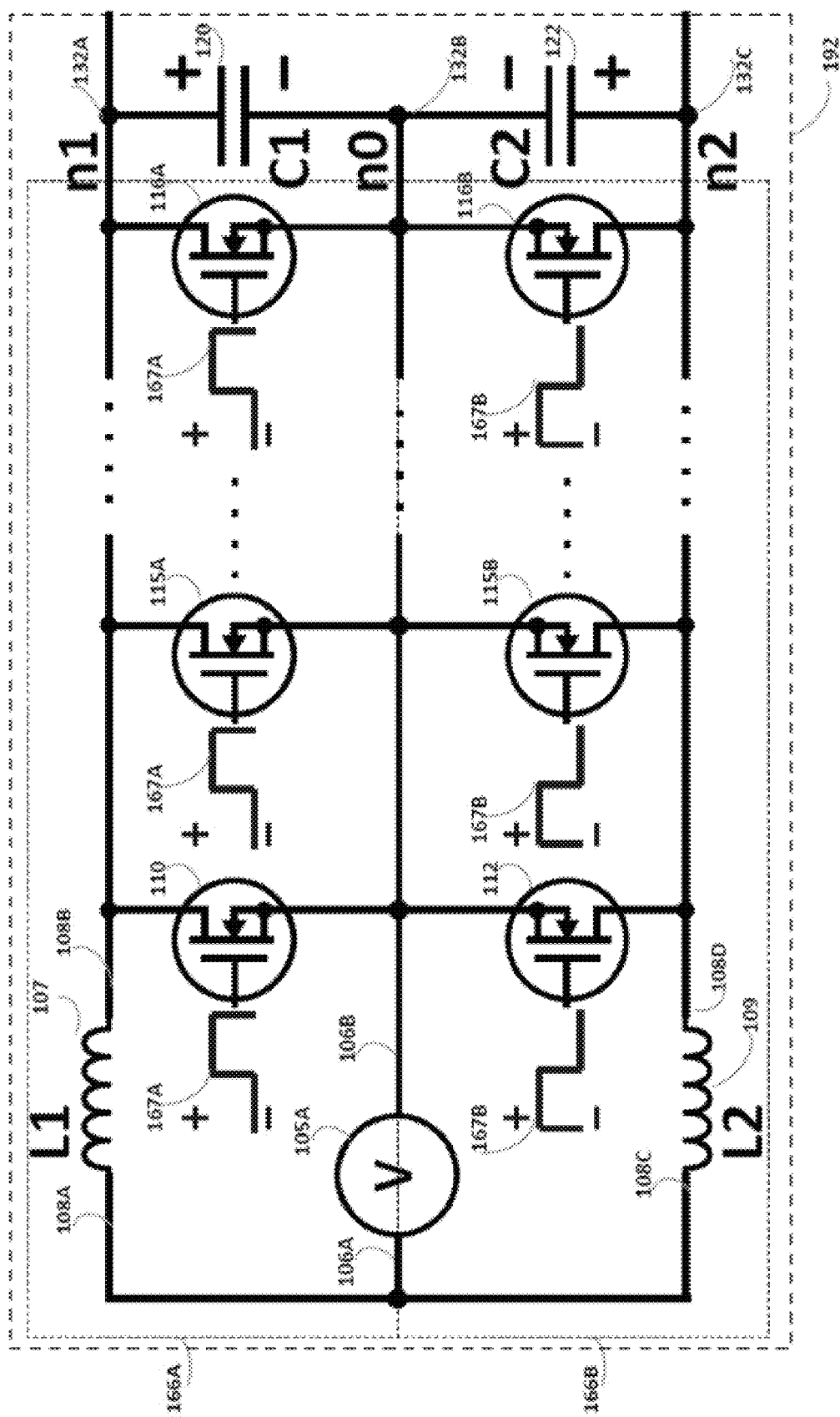

Although FIG. 1A shows two switches, one in each leg of the circuit 190, each leg (e.g., top portion and bottom portion) may include a plurality of switches. FIG. 1B depicts an example embodiment in which the top leg 166A includes a plurality of switches 110, 115A, 116A and the bottom leg 166B includes a plurality of switches 112, 115B, and 116B. In the example of FIG. 1B, switches 110, 115A, 116A in the top leg 166A share a common clock 167A. Likewise, switches 112, 115B, 116B in the bottom leg 166B share a common clock 167B, so the switches in the top leg are gated together, while the switches in the bottom leg are gated together. Clocks 167A and 167B may be implemented in a manner similar as described above with respect to FIG. 1A. The use of a plurality of switches in each leg 166A and 166B as shown in FIG. 1B may enable higher power operation of the circuit 192, when compared to 190. Although FIG. 1B depicts a certain quantity of switches, other quantities may be used as well.

Figure 1C:
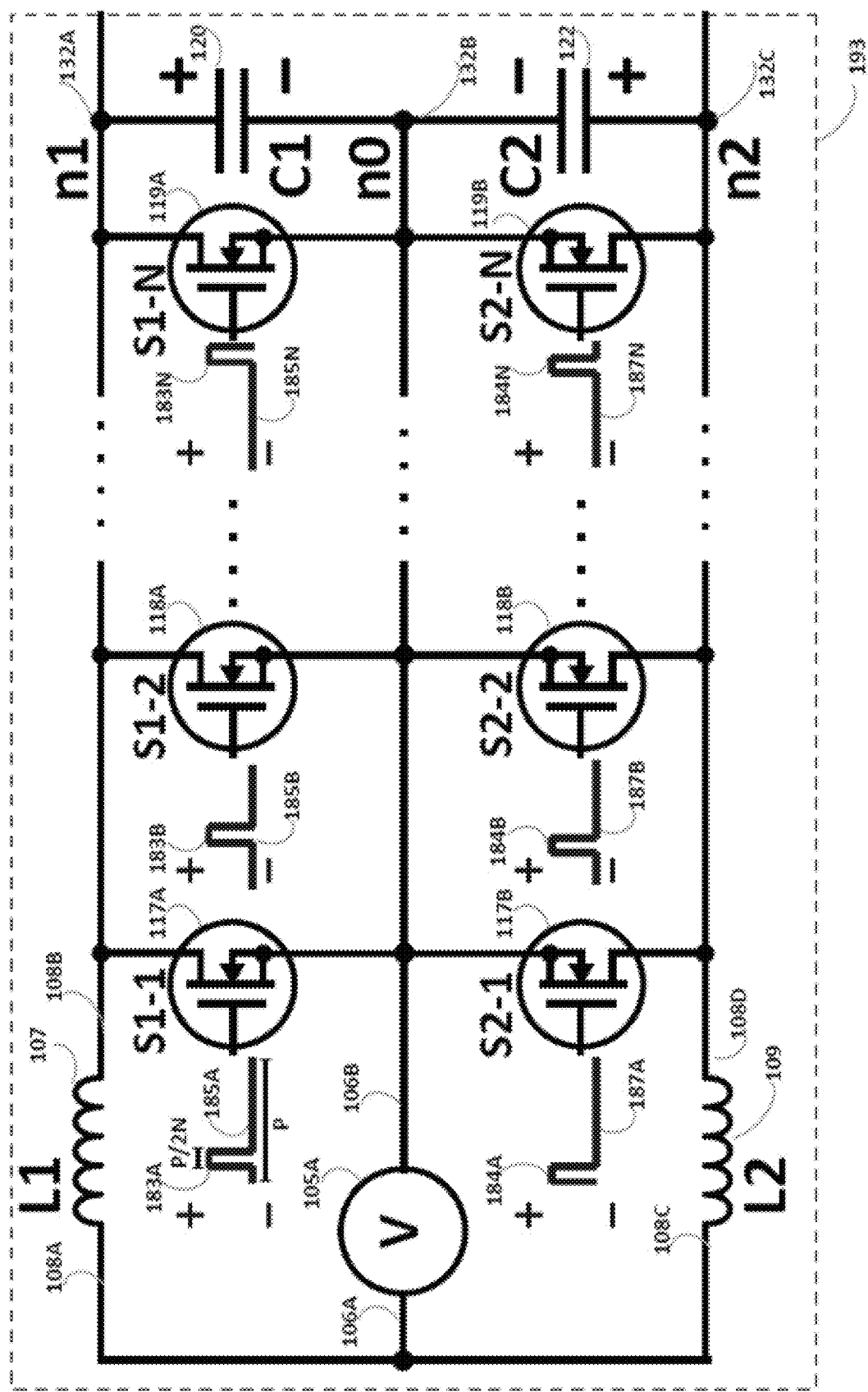

FIG. 1C depicts a resonant amplifier circuit 193 which is similar to circuit 192 in some respects but circuit 193 provides separate clock signals to separately gate the switches. For example, by alternating gating signals 183A-N between a set of N switches, S1-1 (117A), S1-2 (118A), up to S1-N (119A) and alternating gating signals 184A-N between another set of N switches, S2-1 (117B), S2-2 (118B), up to S2-N (119B) alternating operation may be realized as depicted in the timing diagram of 193 in FIG. 1C. Specifically, one complete period, P, is divided into N durations, where in each duration, one pair of switches (e.g., S1-1 [117A] and S2-1 [117B]) each alternately turn on for half the duration to generate one full output cycle. For example, switch S1-1 and switch S2-1 may be configured so that during a first portion of an interval, switch S1-1 is on and then turns off, so that in the next portion of the interval switch S2-1 turns on and then off. Likewise, during another duration (e.g., period of time), another pair of switches (e.g., S1-2 [118A] and S2-2 [118B]) each alternately turn on for half the duration to generate one full output cycle. And, during another duration, another pair of switches (e.g., S1-N [119A] and S2-N [119B]) each alternately turn on for half the duration to generate one full output cycle. FIG. 1C may enable higher operating frequencies in cases where the operating frequency of 190 is limited due to certain characteristics of the switches and/or gating devices, for example, individual switches and gate drives may be thermally limited to a maximum number of switching events per second. Although FIG. 1C depicts a certain quantity of switches, other quantities may be used as well.

Figure 1D:
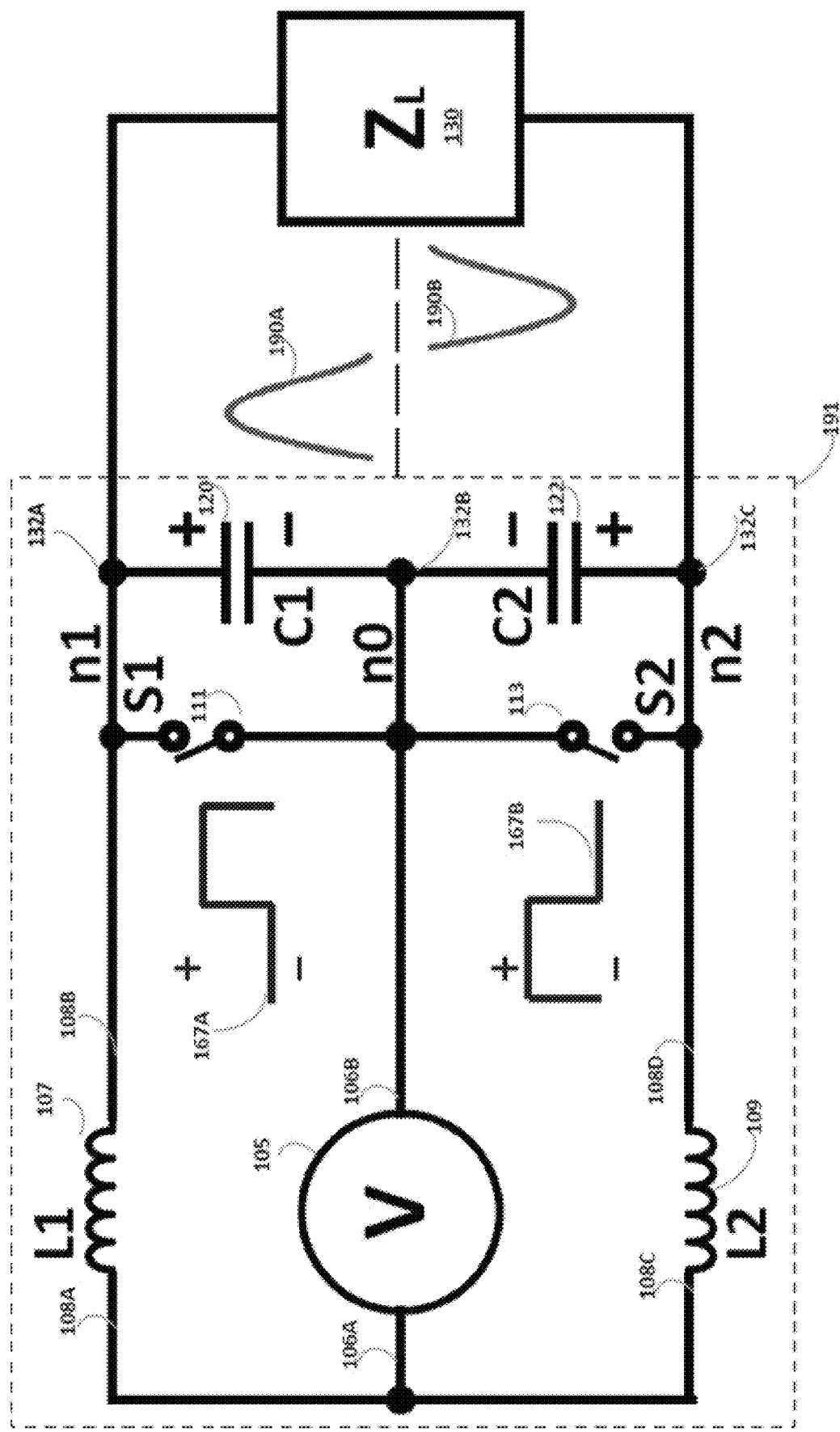

FIG. 1D depicts a resonant amplifier circuit 191 which is similar to circuit 190 in some respects but circuit 191 includes a first switch 111 and a second switch 113 which is more general, so these switches may be implemented with technologies, such as MOSFETs, GaN HEMTs, BJTs, IGBTs, JFETs, thyristors, SCRs, and/or the like depending on the application. Moreover, the switches may be of mixed type, (e.g., switch 111 may be a MOSFET while switch 113 may be implemented using SCRs).

Figure 1E:
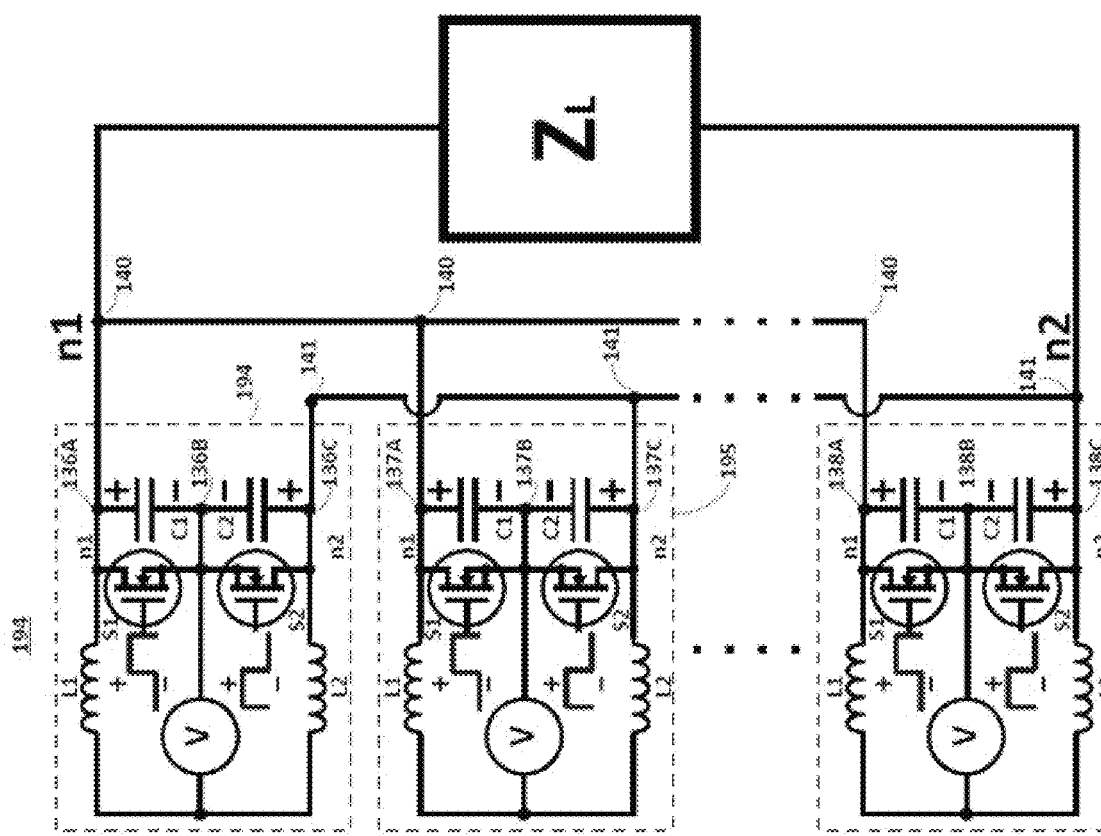

FIG. 1E depicts an example of an array 194 of resonant amplifier circuits 190, in accordance with some example embodiments. Although FIG. 1E depicts 194-196 in an array, other resonant amplifier circuits, such as 191, 192, 193, and/or the like may be included as well in the array. The array 194 of parallel resonant amplifier circuits may enable higher power to a load, when compared to not using an array. Moreover, impedance matching networks or other elements may be inserted at the output of each individual rectifier 190 of the array (e.g., connected between 136A and 140, between 136C and 141, and/or the like) and/or between output nodes 140 and 141, and $Z_L$.

In some example embodiment, the values of inductors 107 and 109 may be in the range of 1 nanoHenry (nH) to 1,000,000 nH, the values of the capacitors 120 and 122 may be in the range of 1 picoFarad (pF) to 1,000,000 pF, the voltage of the DC power source 150 may be in the range of −100 kV to 100 kV, the operating frequency (as dictated by the clock signal) may be in the range of 20 kHz to 3 GHz, and the output power across the load may be in the range of 1 mW to 1 MW, although other ranges/values of these components may be realized as well. In an example implementation of amplifier 100, the values of inductors 107 and 109 are 150 nH, the values of capacitors 120 and 122 include an external capacitance of 200 pF in addition to the switching device capacitance, the voltage of the DC power source 105 may be varied from 0 to 200 V, the switching devices are GaN HEMTs, and the switching frequency is about 13.56 MHz. In the example of FIG. 1A, the circuit 100 was tested at powers up to 3 kilowatts (kW) into a 50-ohm resistive load at 130.

Figure 2:
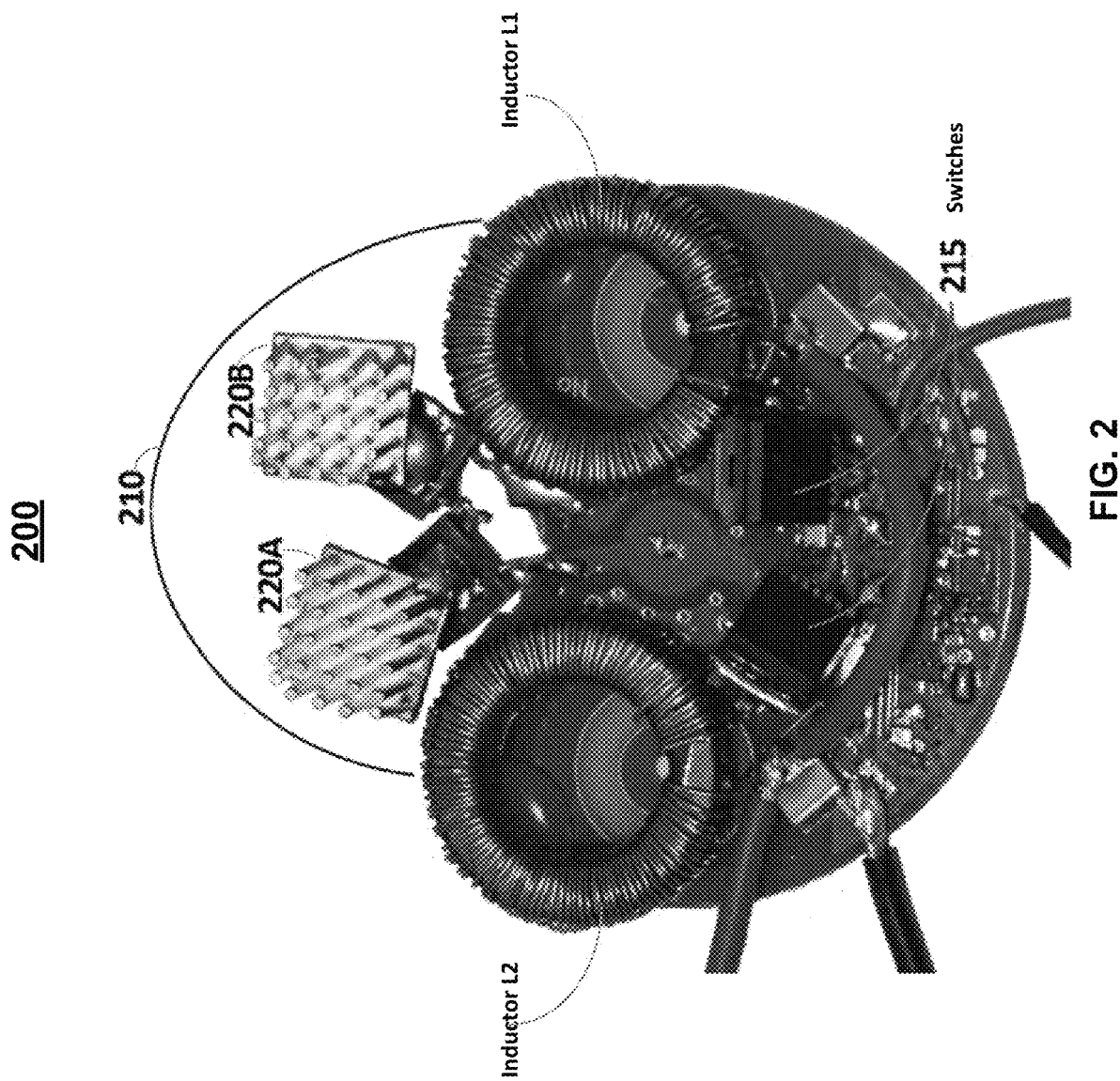
FIG. 2 depicts an example of an implementation of the resonant amplifier circuit of FIG. 1A, in accordance with some example embodiments.

FIG. 2 depicts an example of a prototype implementation 200 of the circuit 100, in accordance with some example embodiments. In the example of FIG. 2, inductors 210 correspond to L1 107 and L2 109 (FIG. 1), 215 corresponds to switches 110 and 112, and 220A and 220B represent load 130 (with a heat sink attached). At FIG. 2, the values of inductors 210 (which correspond to 107 and 109) are 31 microHenries (μH), the values of capacitors 120 and 122 are 30 pF, the voltage of the power source 105 (which in the example of FIG. 2 was implemented as a voltage source) can be varied from 0 to 500 V, the switching devices are Silicon Carbide (SiC) MOSFETs, and the switching frequency is about 2.75 MHz. The resistive load 220-B (which corresponds to 130 in this example) may be in the range of 4,000-400,000 Ohms at powers between 0 and 320 Watts (W).

Figure 3:
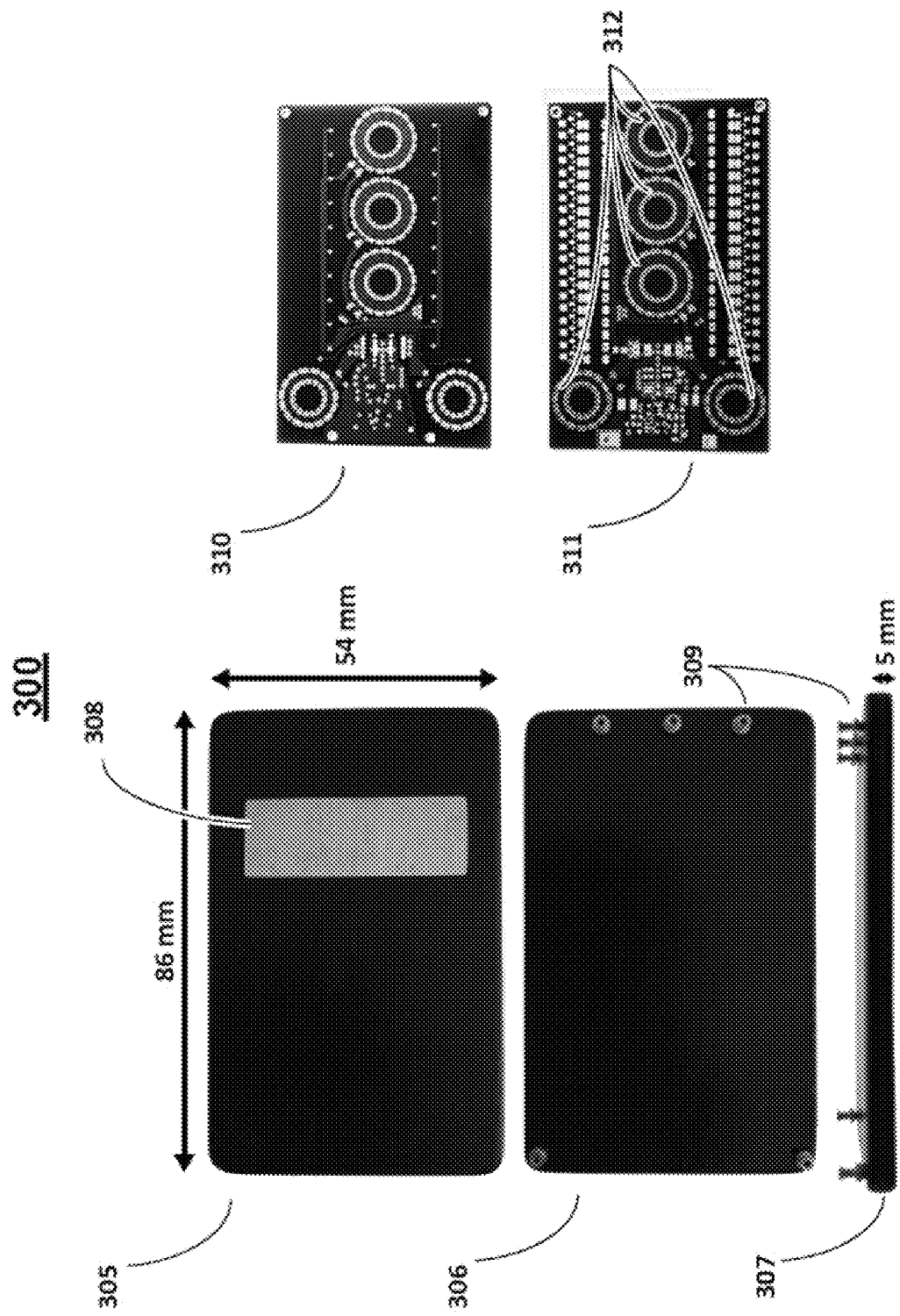
FIG. 3 depicts an example of a DC-DC converter including a resonant amplifier circuit, in accordance with some example embodiments.

FIG. 3 depicts an example of a DC-DC converter, in accordance with some example embodiments. The front 305, back 306, and side 307 views are shown. The system 300 may include a copper heat spreader 308 and power connectors 309. The system 300 may be implemented in a single PCB (front side 310 and backside 311) in which the air core inductors have been directly embedded 312. In the example of FIG. 3, the values of inductors 312 (which correspond to 107 and 109 at FIG. 1) are 130 nH, the values of capacitors 120 and 122 are 1 nF, the voltage of the current source 105 can be varied from 0 to 35 V, the switching devices are GaN HEMTs, and the switching frequency is 8 MHz, although other values may be implemented as well. In the example of FIG. 3, the circuit 100 may be coupled to a rectifier circuit to generate DC output voltages up to 4 kV at powers up to 250 W. As used herein, coupled to does not preclude an intervening component or device, unless expressly stated otherwise. The circuit design at FIG. 3 may support a wide range of values, including 10-40,000 nH for inductors 107 and 109, 0-100 nanoFarads (nF) for capacitors 120 and 122, 0-1,000 V for the voltage of DC power source 105, and an operating frequency range of 20 kHz to 3 GHz, although other values may be implemented as well.

Referring again to FIG. 1A, the circuit 100 may be used for resonant power electronic applications for which an alternating current (AC) waveform is desired across the output, such as at the load 130. The circuit may be implemented to provide soft switching, in which the switches 110 and 112 switch on and off when the corresponding switch voltage or current is at or near zero. Soft switching may enable circuit 100 to operate at high frequencies, such as RF frequencies.

Moreover, the fundamental voltage gain associated with circuit 100, as well as the circuit's 100 ability to operate resonantly on a resistive load 130 with few (if any) additional components, make circuit 100 well-suited for a variety of applications including AC amplification/synthesis, an RF application, a step-up converter, a step-up converter coupled to transformer(s), impedance matching network(s) and/or rectifier(s), and/or other applications as well.

In operation, the first switch 110 and the second switch 112 are driven 180 degrees out of phase at a desired fundamental frequency of operation. And, the associated clock signals 167A/B may have a duty cycle of about 50%. For example, a control terminal (e.g., a gate (labeled "G") or a base) of the first switch 110 may be driven with a control signal, such as a clock signal 167A. The clock signal 167A turns the first switch "on" during the positive portion 170A of the clock. Similarly, the gate (labeled "G") of the second switch 112 may be driven with a control signal, such as a clock signal 167B. The clock signal 167B turns the second switch "on" during the positive 170B portion of the clock. In short, the clock signals 167A-B drive the switches 110 and 112, so that the switches are 180 degrees out of phase.

Although the previous example refers to clock signals 167A-B with a 50% duty cycle and a frequency of operation of 8 MHz, the clock signals may have other duty cycles and frequencies as well. For example, frequencies, such as the Industrial, Scientific, and Medical (ISM) radio bands at 6.78 MHz, 13.56 MHz, 27.12 MHz, and 40.68 MHz may be implemented, although other frequencies may be implemented as well. In some example embodiments, the clock frequency can be specified to an arbitrary value within the range 20 kHz to 3 GHz, provided that the component values are selected accordingly. In some example embodiments, where a continuous sine AC output is not desirable, the duty cycle of the clock signal may not be exactly 50%.

In some example embodiments, the first inductor 107 ($L_1$) and the second inductor 109 ($L_2$) may be resonant with the switching device's output capacitances (sometimes referred to as $C_{oss}$ in the case of a MOSFET) of switches 110 and 112, respectively. The output capacitance of first switch 110 is referred to as the capacitance at the drain or output ($C_{d1}$), while the output capacitance of second switch 112 is referred to as the capacitance at the drain or output ($C_{d2}$). To illustrate further with a MOSFET, the capacitance between the drain (D) ter al and the source (S) terminal of the first switch 110 may be used as $C_{d1}$. Alternatively or additionally, the output capacitance, $C_{d1}$, of the first switch may also include the gate to drain capacitance ($C_{gd}$) of the first switch, and the output capacitance, $C_{d2}$, of the second switch may also include the gate to drain capacitance ($C_{gd}$) of the second switch. Thus in some implementations, the output capacitance represented by capacitor C1 120 is effectively $C_{d1}$, and the output capacitance represented by capacitor C2 122 is effectively $C_{d2}$. The intrinsic capacitance of a switch, such as a MOSFET and/or the like, represents the physical capacitance of a switch itself across terminals of the switch. For example, $C_{oss}$ represents the intrinsic physical capacitance of the switch itself. Although the previous example used MOS- FETs for illustrating the output capacitance of the switch, it can be appreciated that other types of switches may have an output capacitance as well.

In some example embodiments, additional, external capacitance may be added to circuit 100 such that capacitor 120 (C1) and capacitor 122 (C2) include external capacitors $C_{external1}$ and $C_{external2}$ in addition to the switch's output capacitance ($C_{d1}$ and $C_{d2}$). In other words, the output capacitance represented by capacitor C1 120 is effectively the sum of $C_{d1}$ and $C_{external1}$, and the output capacitance represented by capacitor $C_2$ 122 is effectively the sum of $C_{d2}$ $C_{external2}$. Alternatively or additionally, the value of the output capacitance ($C_{oss}$) of the first switch and/or the second switch may be configured or selected as well for tuning. Often, the extra capacitance (e.g., $C_{external1}$ and $C_{external2}$) will be included in the circuit 100 to precisely tune the circuit, so C1 and C2 may often include ($C_{d1}+C_{external1}$) and ($C_{d2}+C_{external2}$).

In operation, the switch capacitances C1 120 and C2 122 are resonant with the inductors $L_1$ 107 and $L_2$ 109, respectively, to shape the output drain voltage waveforms 190A-B, when the output impedance $Z_L$ 130 is substantially resistive. The output waveform 190A-B represents an output that may be achieved via soft switching (e.g., substantially zero voltage switching or substantially zero current switching). However, when $Z_L$ appears significantly inductive or capacitive rather than primarily resistive, the voltage across the switch waveforms may be affected and zero voltage switching can be lost. To compensate for the additional inductive or capacitive element(s) under such conditions, the values of C1 and C2 and/or L1 and L2 may be adjusted by an equivalent amount or by varying switching frequency as necessary to regain zero voltage switching and proper operation. As noted above with respect to an implementation example of FIG. 1A, an inductance of 150 nH and an external capacitance of 200 pF in addition to the switching device capacitance may be selected for resonant operation; in an implementation example of FIG. 2, the values 31 μH and 30 pF were used; and in an implementation example of FIG. 3, the values 130 nH and 1 nF were used, so these different values represent examples of varying the capacitance and/or inductance for tuning.

In some example embodiments, the inductor, L1 107, and the inductor, L2 109, may be selected in accordance with the following equations as a starting point, and may require additional iterative tuning depending on the operation of the amplifier circuit:

$$L1 = 1/(4 * \pi^2 * f^2 * C1); \text{ and}$$

$$L2 = 1/(4 * \pi^2 * f^2 * C2),$$

wherein $f$ corresponds to frequency, C1 corresponds to capacitor C1 120 and C2 corresponds to capacitor C2 122, and * corresponds to multiplication, and "/" to division.

Figure 4:
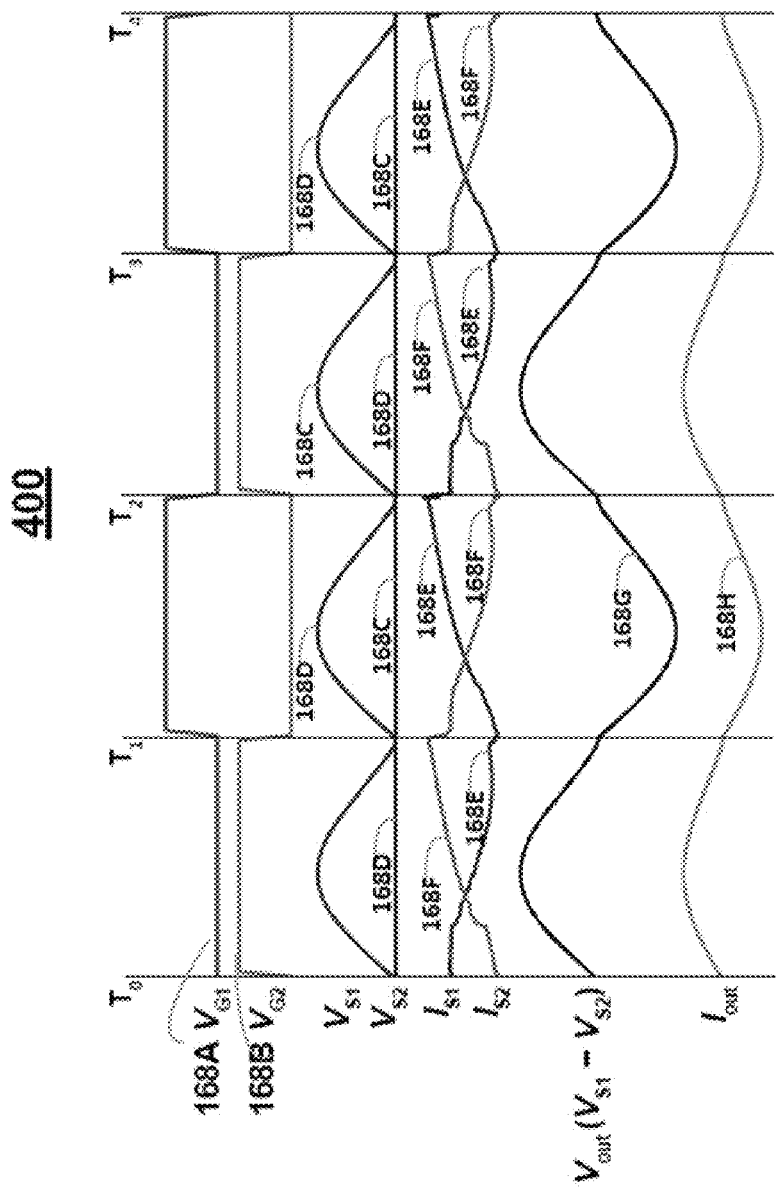
FIG. 4 depicts an example of a timing diagram obtained from the circuit of FIG. 1A, in accordance with some example embodiments.

FIG. 4 depicts an example of a timing diagram associated with circuit 100 and, in particular, the device depicted at FIG. 2. The top two traces show the gating clock signal voltages for S1 168A ($V_{G1}$) and S2 168B ($V_{G2}$), which are 180 degrees out of phase. The next two traces 168C-D show the resulting voltages across switch S1 between n1 and n0 ($V_{S1}$, 168C) and switch S2 between n2 and n0 ($V_{S2}$, 168D), respectively. These waveforms are also 180 degrees out of phase. In this example, the voltages reach 0 V coincident with the change in gating voltages to achieve zero voltage switching and thus reduce (if not eliminate) switching losses. The corresponding current across switch S1 ($I_{S1}$, 168E) and switch S2 ($I_{S2}$, 168F) are shown as well. The combined voltage across switch S1 and S2 ($V_{out}=V_{S1}-V_{S2}$, 168G) is nearly sinusoidal, without the addition of any filtering elements. As the load is resistive, the corresponding output current ($I_{out}$, 168H) is in phase with $V_{out}$. The period ($T_2-T_0$) is equal to the reciprocal of the operation frequency. As an example, the period is 363.4 ns and the half-period ($T_1-T_0$) is 181.8 ns, corresponding to a switching frequency of 2.75 MHz.

Referring again to FIG. 1A, component selection may tune the resonant amplifier circuitry 100 to provide an AC signal, which corresponds to the substantially half sine waves 190A-B. The output capacitances $C_{d1}$ and $C_{d2}$ may depend on the selected types of switches (e.g., the physical characteristics of the switches, which in this example is MOSFETs, although other types may be used). As such, the primary tuning of circuit 100 may be performed by adjusting the inductances L1 107 and L2 109. For some types of load values however, it may not be possible to tune, as noted above, without adding external capacitors, $C_{external1}$ and $C_{external2}$. As the switches 110 and 112 are driven 180 degrees out of phase, the voltage waveform between $n_1$ 132A and $n_2$ 132C may approximate an AC sine wave, such as the half sine waves of 190A-B/168C-D. The shape of this half sine waves may need, as noted, very little (if any) filtering to achieve relatively low harmonic distortion as shown at 168G.

In some example embodiments, the DC potential difference between nodes $n_1$ 132A and $n_2$ 132C is about zero. As such, there may be no need for DC filtering, such as DC blocking capacitors or other isolation mechanisms, between nodes $n_1$ and $n_2$ 132A/132C and the load 130. In some embodiments, however, DC filters (e.g., DC blocking capacitors, or other forms of isolation) may be implemented to provide, for example, filtering, output isolation, and/or the like.

Figure 5:
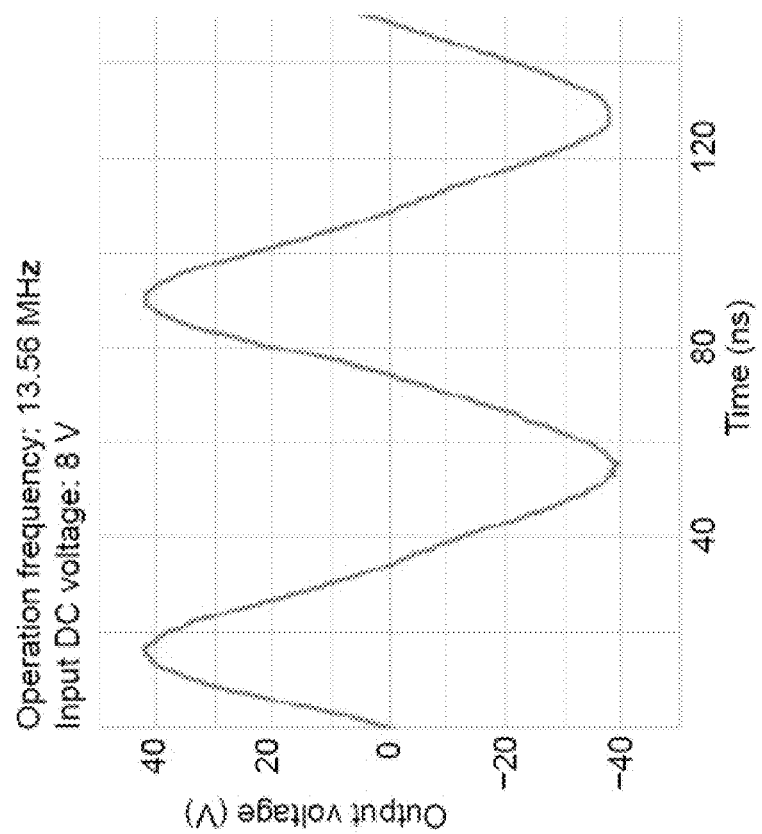
FIG. 5 depicts an example of a plot of an output waveform for the circuit of FIG. 1A, in accordance with some example embodiments.

FIG. 5 depicts another example of a plot of the output voltage across the load 130 of the circuit 100 and, in particular, the plot for the example implementation at FIG. 3. The plot of the output voltage corresponds to nodes $n_1$ 132A and $n_2$ 132C into a 20 ohm resistive load at 130. The sinusoidal nature of the voltage waveform may be achieved, without the addition of additional filtering elements.

Figure 6:
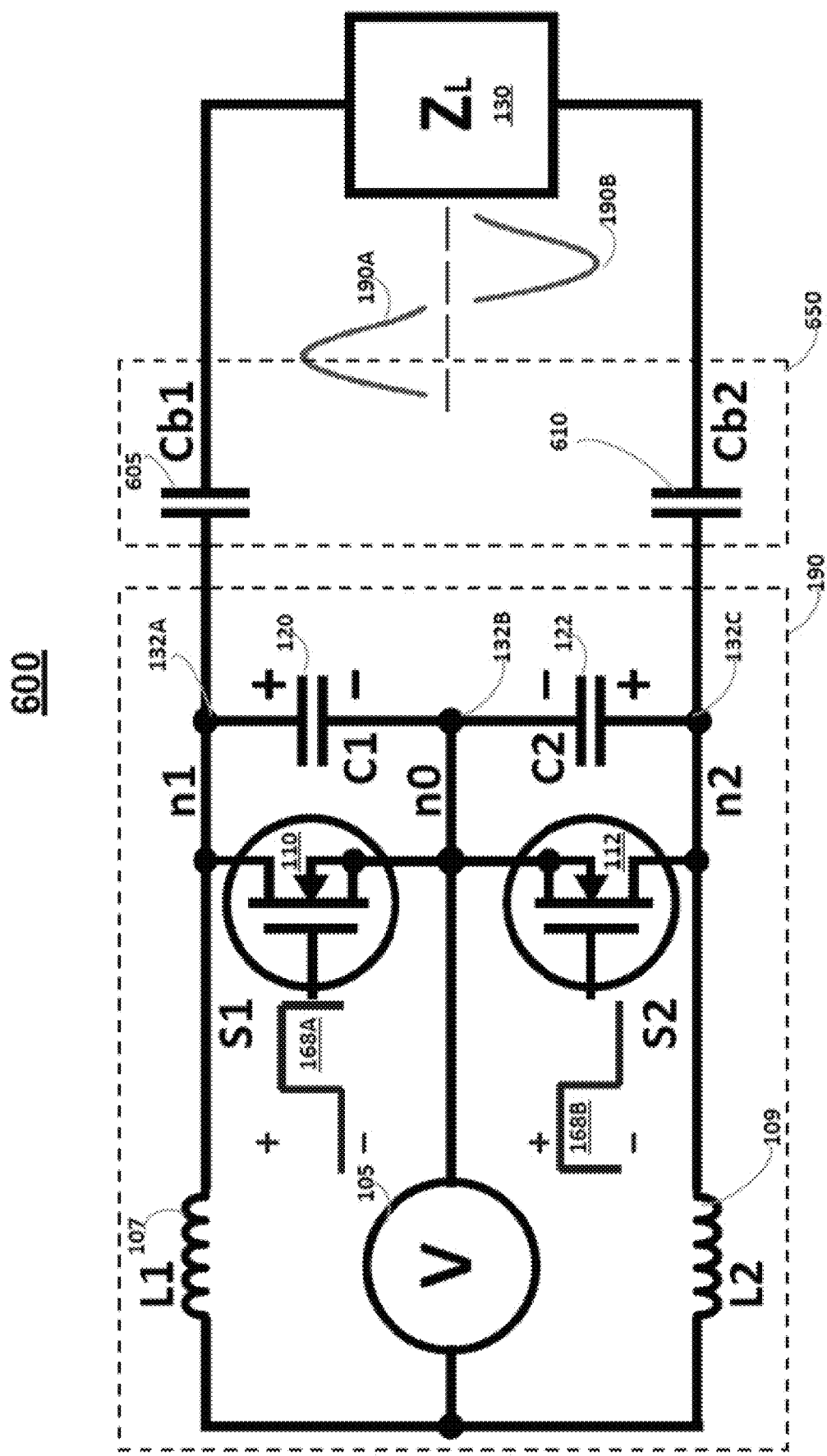
FIG. 6 depicts another example of a resonant amplifier circuit, in accordance with some example embodiments.

FIG. 6 depicts an example of a circuit 600, in accordance with some example embodiments. The circuit 600 is similar to circuit 100 in some respects but circuit 600 further includes a blocking circuit 650 comprising DC blocking capacitors 605 and 610 between the output of 190 and the load 130. The DC blocking capacitors 605 and 610 may provide some DC filtering (e.g., blocking of the DC so it does not reach load 130) as well as additional output isolation between the circuit 190 and the load 130. In the example of FIG. 6, the blocking capacitor (Cb1) 605 is coupled between node n1 132A and the output load 130. The blocking capacitor 605 may block (e.g., filter) DC from reaching the output load 130. Similarly, the blocking capacitor (Cb2) 610 is coupled between node n2 132C and the output load 130. The blocking capacitor 610 may block DC from reaching the output load 130. Although FIG. 6 depicts circuit 190, other circuits such as 191-194 may be used as well.

Figure 7:
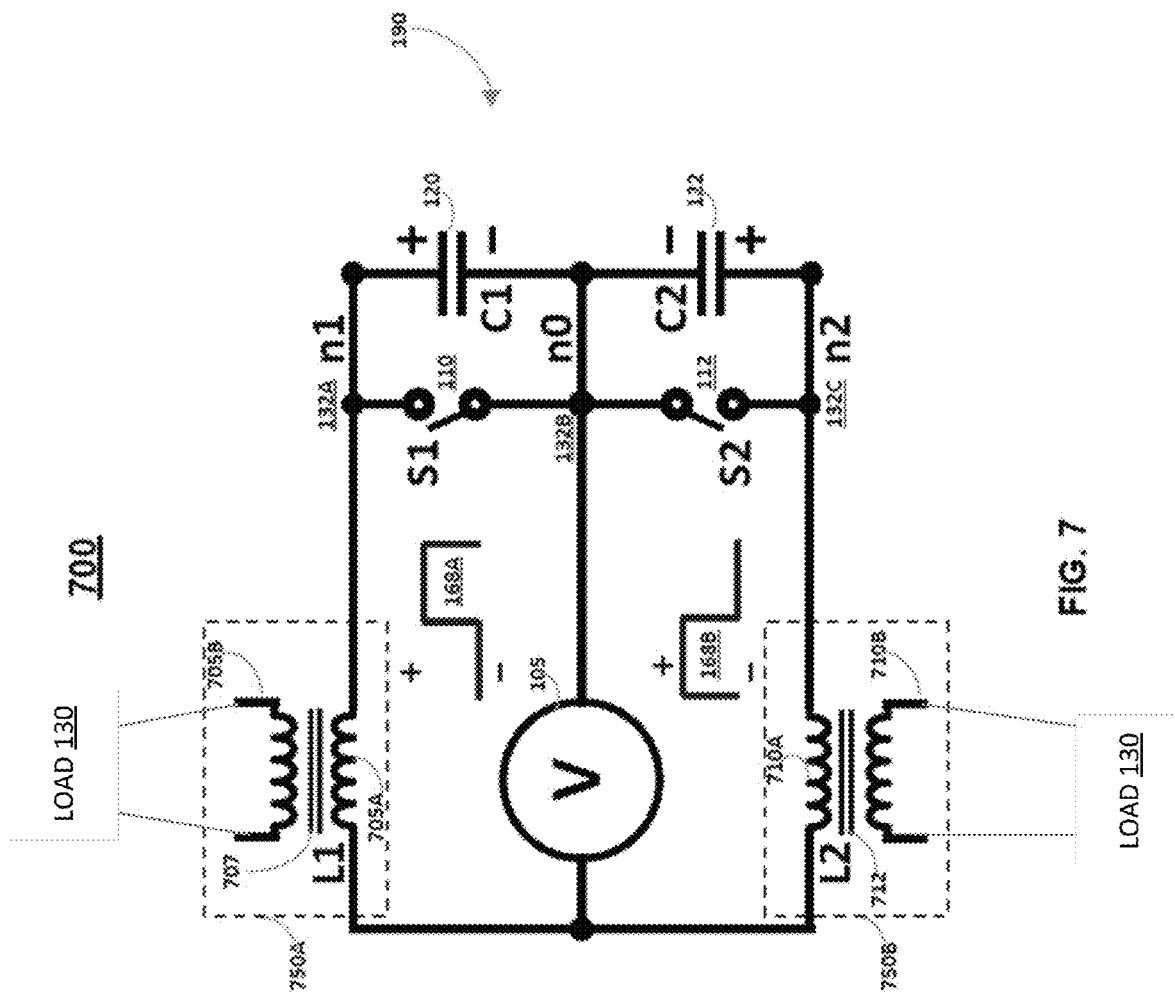
FIG. 7 depicts yet another example of a resonant amplifier circuit, in accordance with some example embodiments.

FIG. 7 depicts an example of a circuit 700 including magnetic coupling 750A-B, in accordance with some example embodiments. The magnetic coupling may take the form of primaries of a transformer(s), although other types of magnetic coupling including magnetically heated loads, plasma loads, and/or the like may be used as well. The addition of magnetic coupling may enable galvanic isolation for amplifier output with respect to the input power source.

In the case of FIG. 7, primary winding 705A and secondary winding 705B of transformer 707 are implemented, and primary winding 710A and secondary winding 710B of transformer 712 are implemented as well. Although FIG. 7 depicts circuit 190, other circuits such as 191-194 may be used as well.

Circuit 700 is similar to circuit 100 in some respects but circuit 700 includes (as the first inductor 107 and the second inductor 109) magnetic coupling in the form of the primaries 705A and 710A of the transformers 707 and 712, respectively. In the circuit 700, the transformers 707 and 712 are tuned inductive elements and store resonant energy in the form of a magnetic field. As such, the transformers 707 and 712 may be used to transmit energy to an load(s) across the secondary 705B and/or across the secondary 710B of the transformers. A higher secondary to primary turn ratio may also increase the gain of the circuit 700. Alternatively or additionally, a lower secondary to primary turn ratio may be used to decrease the gain of the circuit 700. Moreover, the secondary windings may be connected in series or parallel to get higher voltage or higher current, respectively.

The transformer 750A may include primary windings 705A coupled on one side to the power source 105 and coupled on the other side to the switch 110. The secondary 705B may be coupled to a load. The transformer 750B may include primary windings 710A coupled on one side to the power source 105 and coupled on the other side to the switch 112. The secondary 710B may be coupled to a load.

Although FIG. 7 depicts a certain quantity of primary windings and a certain quantity of secondary windings, other quantities may be implemented as well. Moreover, other quantities of magnetic coupling 750A-B may be implemented (e.g., fewer or more than 2 transformers may be used at 750A-B). Moreover, although FIG. 7 depicts the same load at magnetic coupling 750A-B, different loads may be present as well. Moreover, only a single load 130 may be present on only one of magnetic coupling 750A-B.

In some example embodiments, the outputs of resonant circuits 190, such as the outputs at nodes n1 and n2 may be coupled to an impedance matching network before being provided to an output load, such as load 130.

Figure 8:
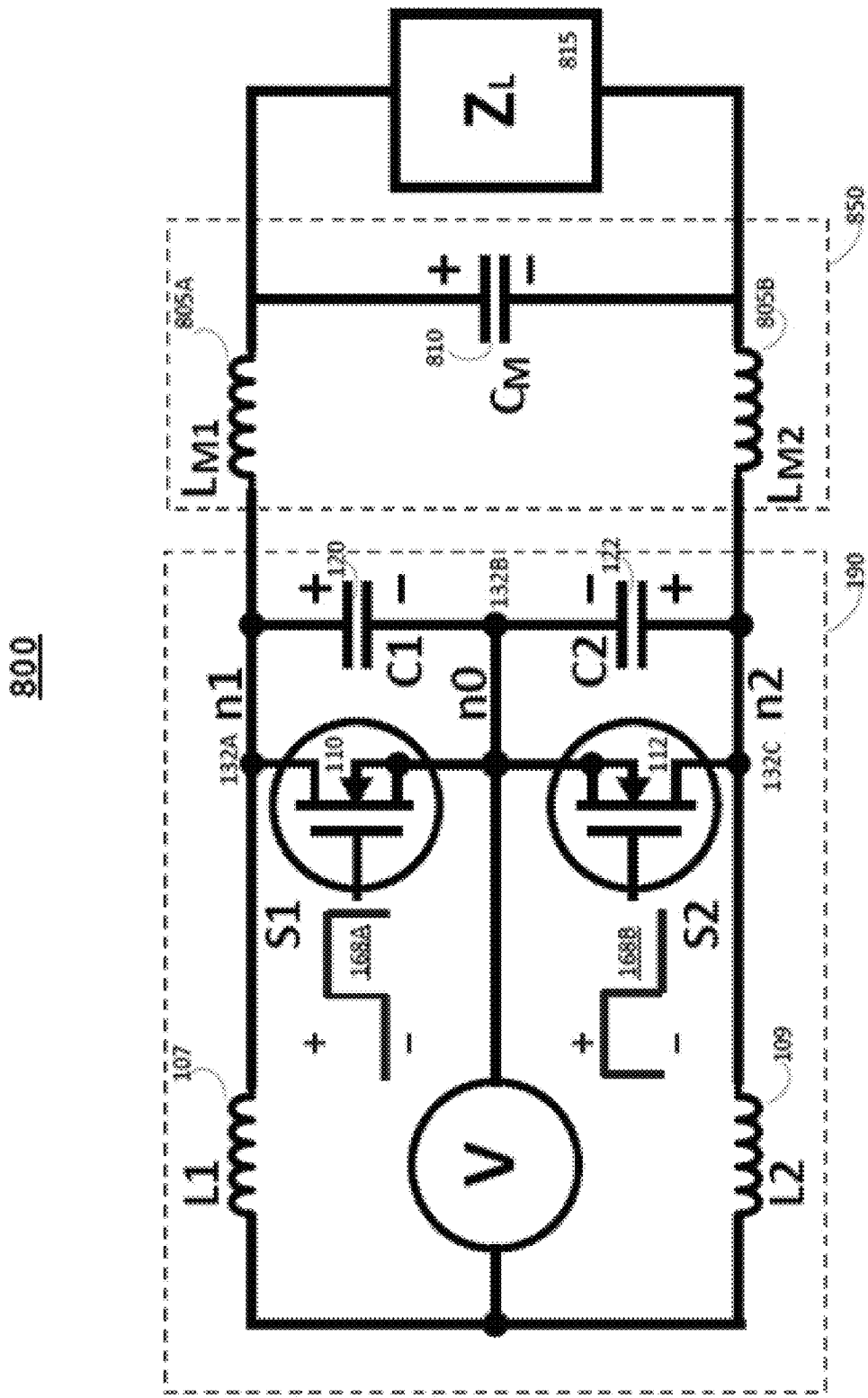
FIG. 8 depicts an example of a resonant amplifier circuit including a matching network, in accordance with some example embodiments.

FIG. 8 depicts an example of a system 800 including impedance matching circuit 850, in accordance with some example embodiments. The system 800 is similar in some respects to the resonant circuit 190 shown at FIG. 1A, for example. However, the outputs at nodes n1 and n2 of the resonant circuit 190 may be coupled to an impedance matching circuit 850 comprising inductors 805A and 805B and capacitor 810 to provide impedance matching for a given load, such as load 815. Although FIG. 8 depicts two inductors 805A and 805B, these inductors may be combined into a single inductor without modifying the behavior of circuit 800.

In the example embodiment of FIG. 8, the first inductor 805A includes a first inductor input and a first inductor output. The first inductor input is coupled to n1 132A (which is further coupled in parallel to the drain of the first switch 110 and the capacitor 120). The first inductor output is coupled in parallel to capacitor 810 and load 815. The second inductor 805B includes a second inductor input and a second inductor output. The second inductor input is coupled to n2 132C (which is further coupled in parallel to the drain of the second switch 112 and the capacitor 122). The second inductor output is coupled in parallel to capacitor 810 and load 815.

In an example implementation of FIG. 8, the values of inductors 107 and 109 are 150 nH, the values of capacitors 120 and 122 are 680 pF (which is in addition to the switch capacitance), the values of inductors 805A and 805B are 180 nH, the value of capacitor 810 is 510 pF, the voltage of the DC current source 105 may be varied from 0 to 120 V, the switches are GaN HEMPTs, the load 815 is 50 ohm, and the switching frequency is 13.56 MHz, although other values may be implemented in accordance with the teachings disclosed herein. Although FIG. 8 depicts circuit 190, other circuits such as 191-194 may be used as well.

Figure 9:
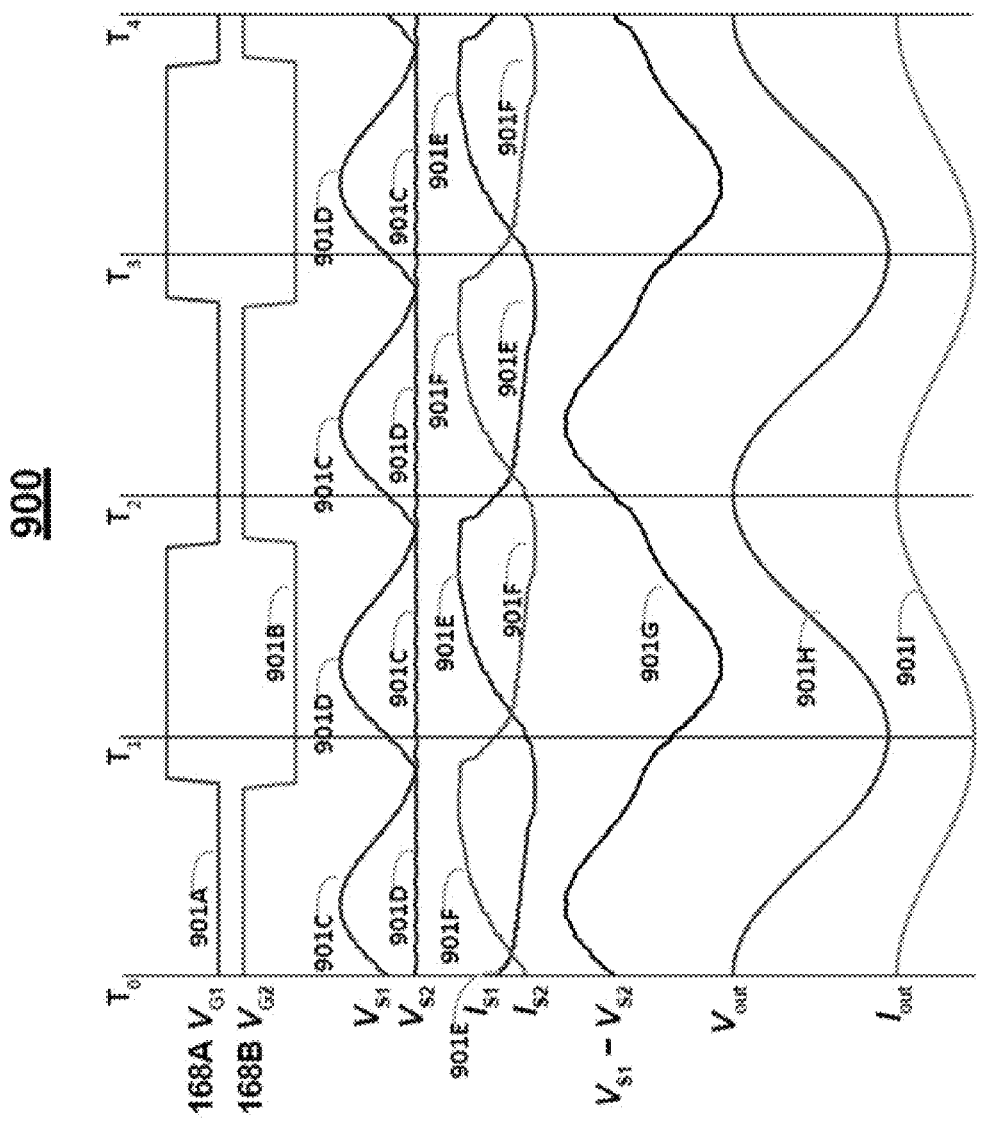
FIG. 9 depicts an example of a timing diagram obtained from the circuit of FIG. 8, in accordance with some example embodiments.

FIG. 9 depicts an example of a timing diagram associated with circuit 800. The top two traces 901A-B show the gating, clock signal voltages for S1 168A ($V_{G1}$ 901A) and S2 168B ($V_{G2}$ 901B), which are 180 degrees out of phase. The next two traces 901C-D show the resulting voltages across switch S1 ($V_{S1}$ 901C) and switch S2 ($V_{S2}$ 901D). These waveforms are also 180 degrees out of phase. In this example, the voltages reach 0 V coincident with the change in gating voltages to achieve zero voltage switching and thus eliminate switching losses.

The traces 901E-F depict the current across each of switch S1 ($I_{DS1}$ 901E) and switch S2 ($I_{DS2}$ 901F). The trace 901G depicts the combined voltage across switch S1 and S2 ($V_{S1}-V_{S2}$) which is nearly sinusoidal. Trace 901H depicts the resulting output voltage ($V_{out}$ 901H) after filtering by the low-pass matching network 805. The corresponding output current ($I_{out}$ 901I) after the low-pass matching network 850 is also shown. The time points $T_0$, $T_2$, and $T_4$ represent times of maximum output voltage. The period ($T_2-T_0$) is equal to the reciprocal of the operating frequency. As an example, the period is 73.74 ns and the half-period ($T_1-T_0$) is 36.9 ns for an operating frequency of 13.56 MHz.

Figure 10:
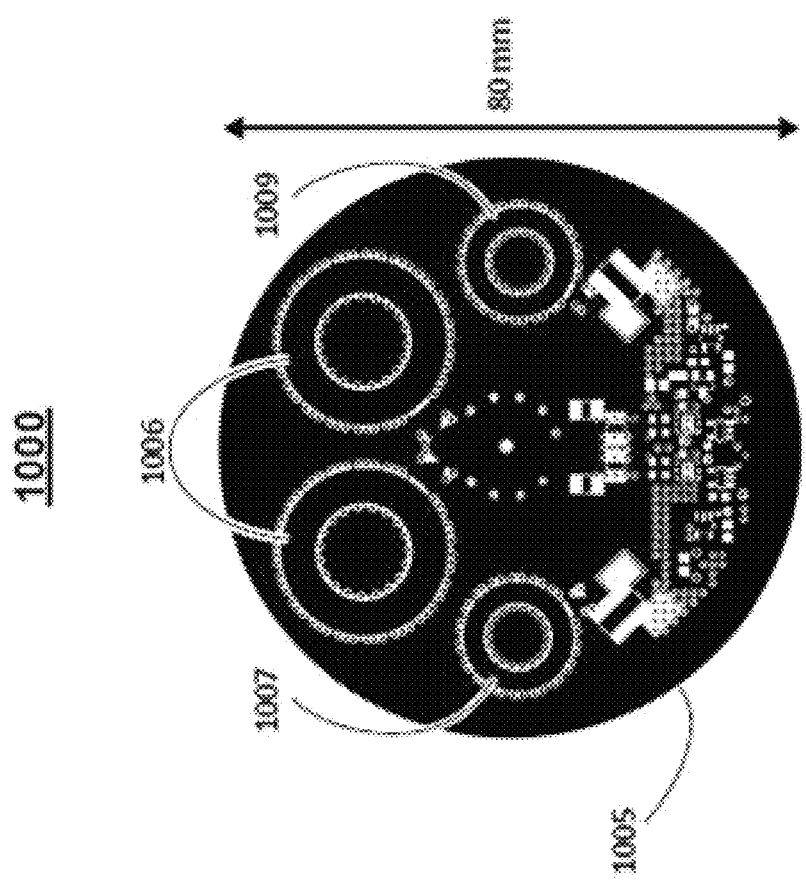
FIG. 10 depicts an example of an implementation of the resonant amplifier circuit of FIG. 8, in accordance with some example embodiments.

FIG. 10 depicts an example of a printed circuit board (PCB) 1005 implementation 100 for the example embodiment of FIG. 8. The matching circuit 850 of FIG. 8 may be used, although other types of impedance matching circuits, such as 650 and/or the like, may be used instead.

At FIG. 10, the inductors 805A, and 805B are depicted at 1006, inductor 107 is depicted at 1007 and inductor 109 is depicted at 1009. These inductors are implemented as high performance embedded air-core toroidal inductors. The inductors of 805A and 805B approximate toroidal inductors by realizing the windings by traces and/or planes and/or vias on and between different layers of a PCB. Alternatively or additionally, inductors may be implemented in other forms within or on PCB to approximate other structures (e.g. solenoids, spirals, etc.) on or between 1 or more layers.

As noted above, the nature of tuning for a resistive load allows $L_1$ and $L_2$ to be much smaller in value than if they were serving as a traditional "choke" inductor, such as would be found in a Class E type amplifier. Because of the resonant behavior of the drain voltage waveforms, the resultant RMS voltage seen by the load 130 or 815 (FIG. 1 or 8) may be significantly higher than the DC bus voltage (e.g., about 2-4 times depending on tuning) and may require little (if any) filtering.

Figure 11:
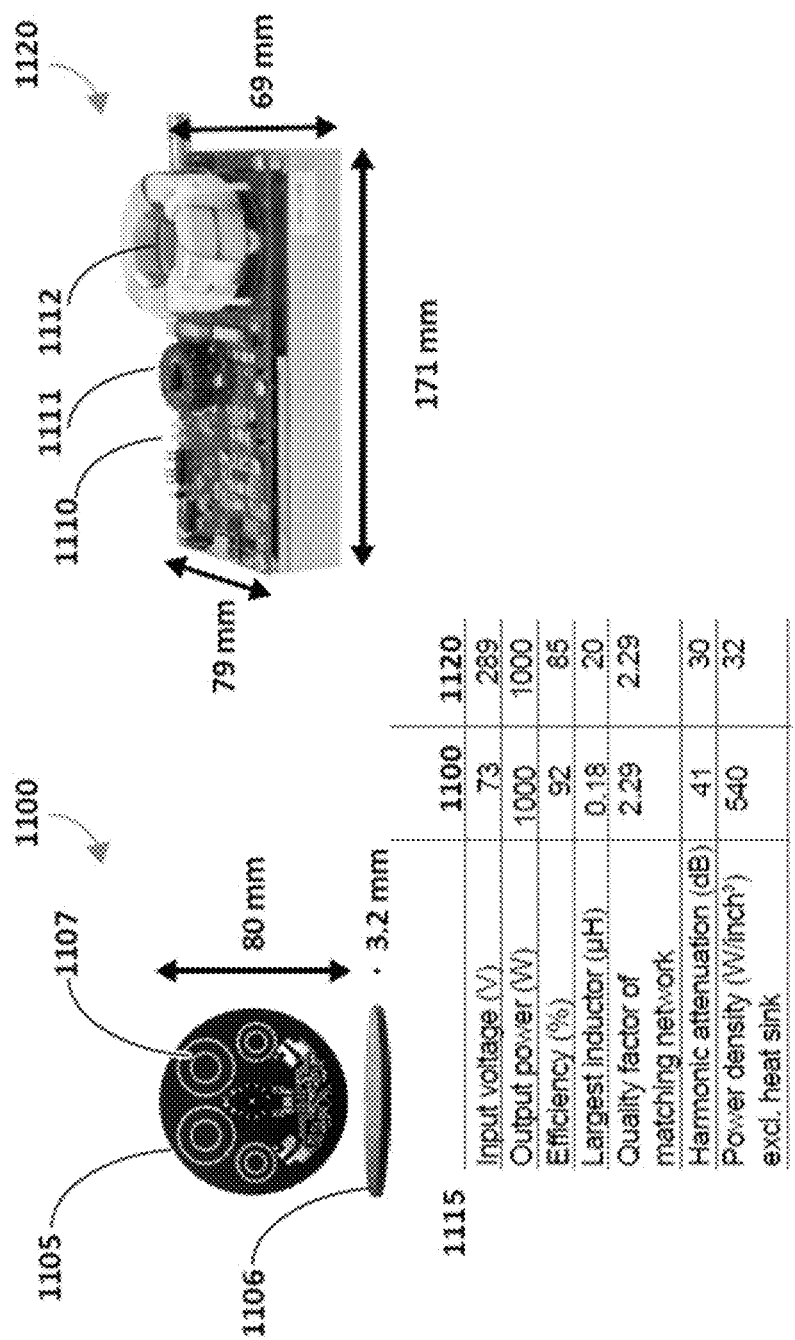
FIG. 11 depicts an example set of specifications for the implementation of FIG. 10, and contrasts the implementation with a prior product, in accordance with some example embodiments.

FIG. 11 depicts an example of a comparison between the example embodiment 1100 (which is similar to FIG. 8 and what is depicted at FIG. 10 1000) and a prior class E amplifier 1120.

Both designs 1100 and 1120 include a low-pass matching network with the same or similar quality factor (Q). While both designs deliver 1000 W into a 50 ohm load, the higher gain of circuit 1100 may require a much lower input voltage (73 volts (V) vs. 289 V) to achieve the same or similar output power. Moreover, the efficiency of the circuit 1100 is higher (92% vs. 85%), when compared to the class E 1120, and the largest harmonic in the output signal of circuit 1100 is significantly lower (41 dB vs. 30 dB), when compared to the class E 1120. Moreover, the circuit 1100 may have a higher power density (calculated without heat sinks for both designs), when compared to the class E circuit 1120 due in part to the need for larger-value inductive elements necessary in the conventional class E 1120. More specifically, the largest inductor in the circuit 1100 is 180 nH, allowing inductor 1100 to be implemented as an air-core inductor and enabling it to be embedded in the PCB, while the largest inductor in the class E circuit 1120 is much too large (20,000 nH). Although FIG. 11 depicts examples of performance results, these are examples, so results may vary depending on the implementation.

The system 1100 shows the front view 1105 of the PCB, a side view 1106 of the PCB and the embedded air core inductors 1107. The prior system 1120 includes a large choke inductor 1111 and large inductor 1112. Examples of parameters are listed in the table 1115, which shows that for an identical power and quality factor of the matching network, the input voltage is nearly four times lower and the efficiency is higher for the circuit 1100, with the prior circuit 1120 experiencing nearly twice the loss during operation. Furthermore, the inductance of the largest inductor is more than 100-fold lower for the circuit 1100 and the power density is more than an order of magnitude higher, when compared to the prior circuit 1120.

Figure 12:
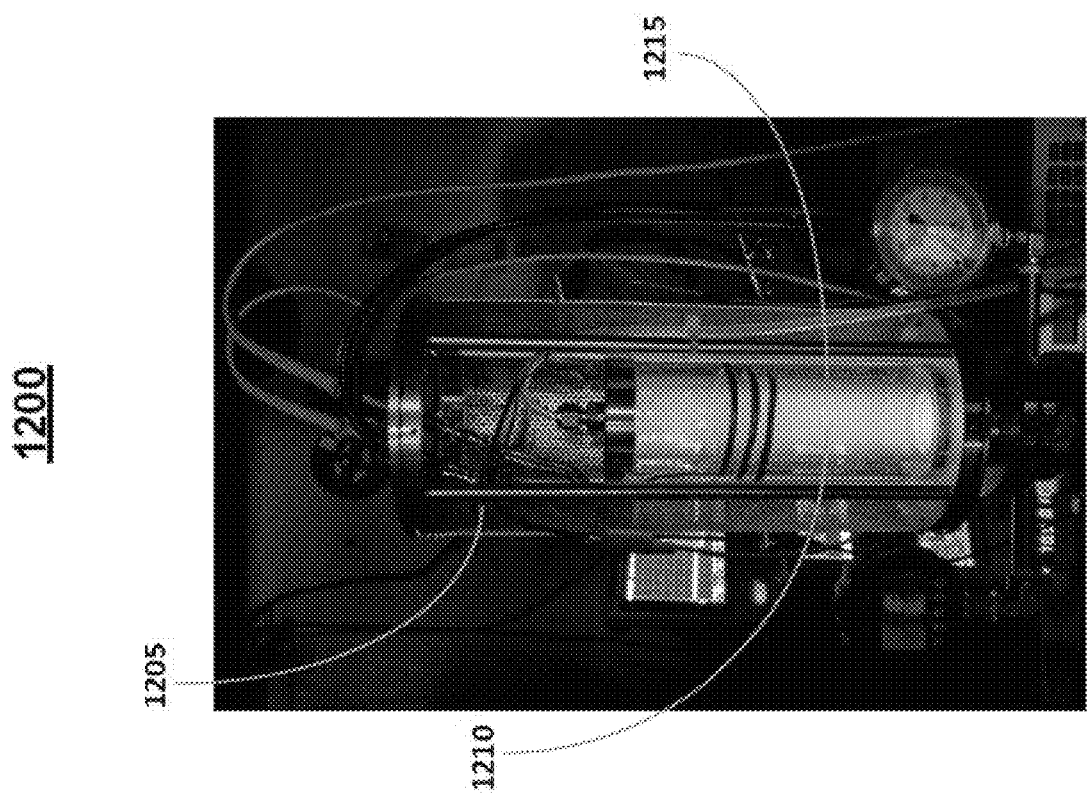
FIG. 12 depicts the example resonant amplifier of FIG. 10 driving an inductively coupled plasma, in accordance with some example embodiments.

FIG. 12 shows an example of an embodiment including the circuit 1000 (FIG. 10), in accordance with some example embodiments. FIG. 12 shows the circuit 1000 (located at 1205) powering a low vacuum, inductively coupled nitrogen plasma 1210, within a glass tube 1215. The plasma of FIG. 12 may be generated at pressures between 20 and 2,000 mTorr and peak powers may be 1 kW.

Figure 13:
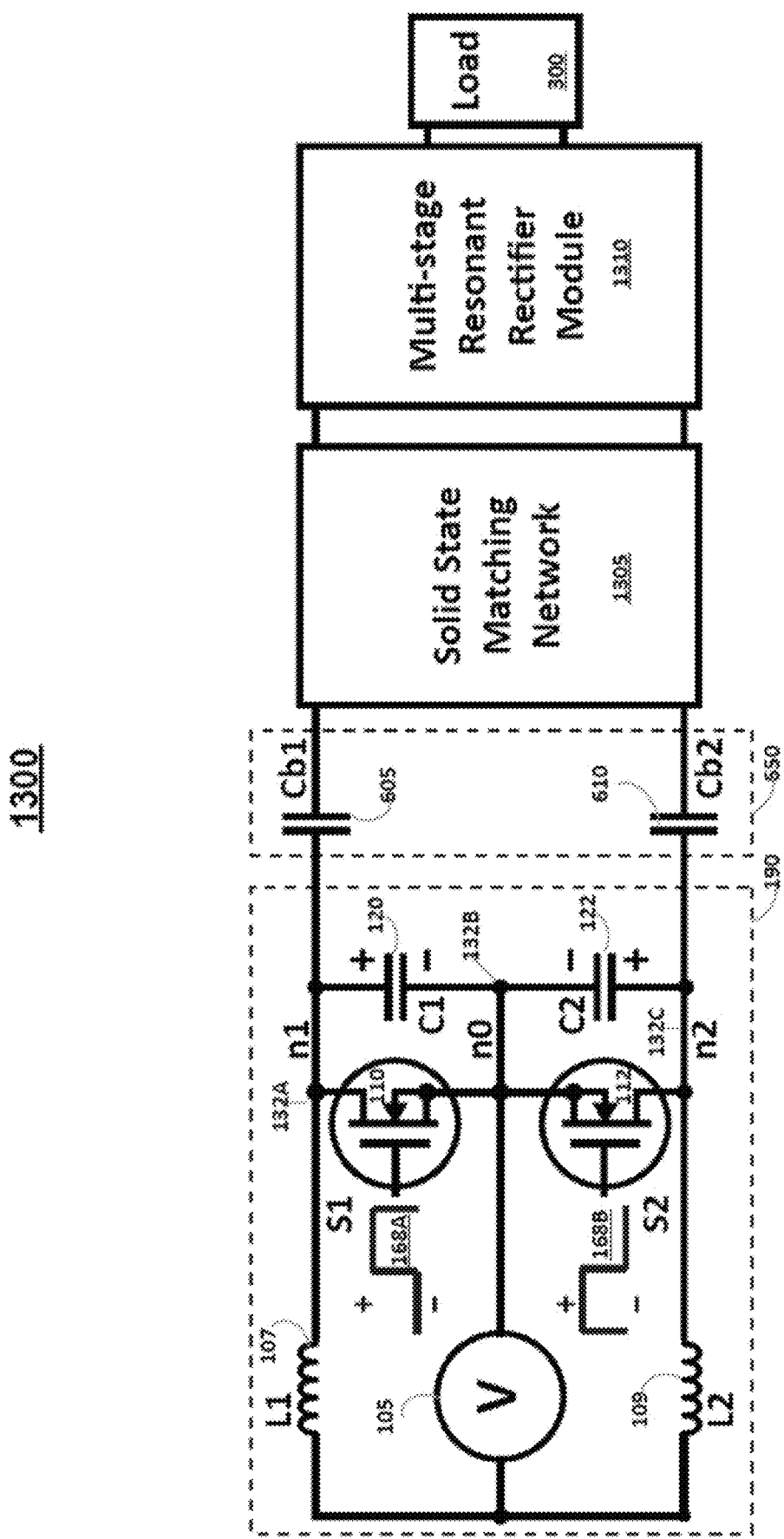
FIG. 13 depicts an example of a resonant amplifier circuit including a matching network and a resonant rectifier, in accordance with some example embodiments.

FIG. 13 depicts a resonant amplifier circuit 1300, in accordance with some example embodiments. The resonant circuit 190 may couple at the outputs n1 132A and n2 132C to DC blocking circuit 650 to provide filtering. The DC blocking circuit output may provide an output to an impedance matching circuit 1305 (labeled "Solid State Matching Network) to provide impedance matching to the load 130. The output of the impedance matching circuit 105 may be provided to a rectifier 1310 (labeled "Multi-Stage Resonance Rectifier Module") to convert the AC output of the amplifier circuit 190 into a rectified output, such as a DC output. The rectifier module 1310 may be implemented as a multi-stage resonant rectifier. An example of a multi-stage resonant rectifier is described in FIG. 14.

Although FIG. 13 depicts blocking capacitors 605 and 610, the blocking capacitors may be omitted, in which case node n1 132A and node 132C would couple directly to the solid-state matching network 1305. Although FIG. 13 depicts circuit 190, other circuits such as 191-194 may be used as well.

As noted above, the resonant circuits disclose herein, such as 100, 600, 700, 800, 1300, 1400, and/or the like, may be implemented in a printed circuit board (PCB) form factor to enable smaller sizes, when compared to other comparable amplifiers. Moreover, these circuits including the PCB form, such as shown at 1000 (FIG. 3) as well as FIG. 10 and FIG. 20, may be implemented in a variety of technology applications to provide unique and surprising results.

Figure 14:
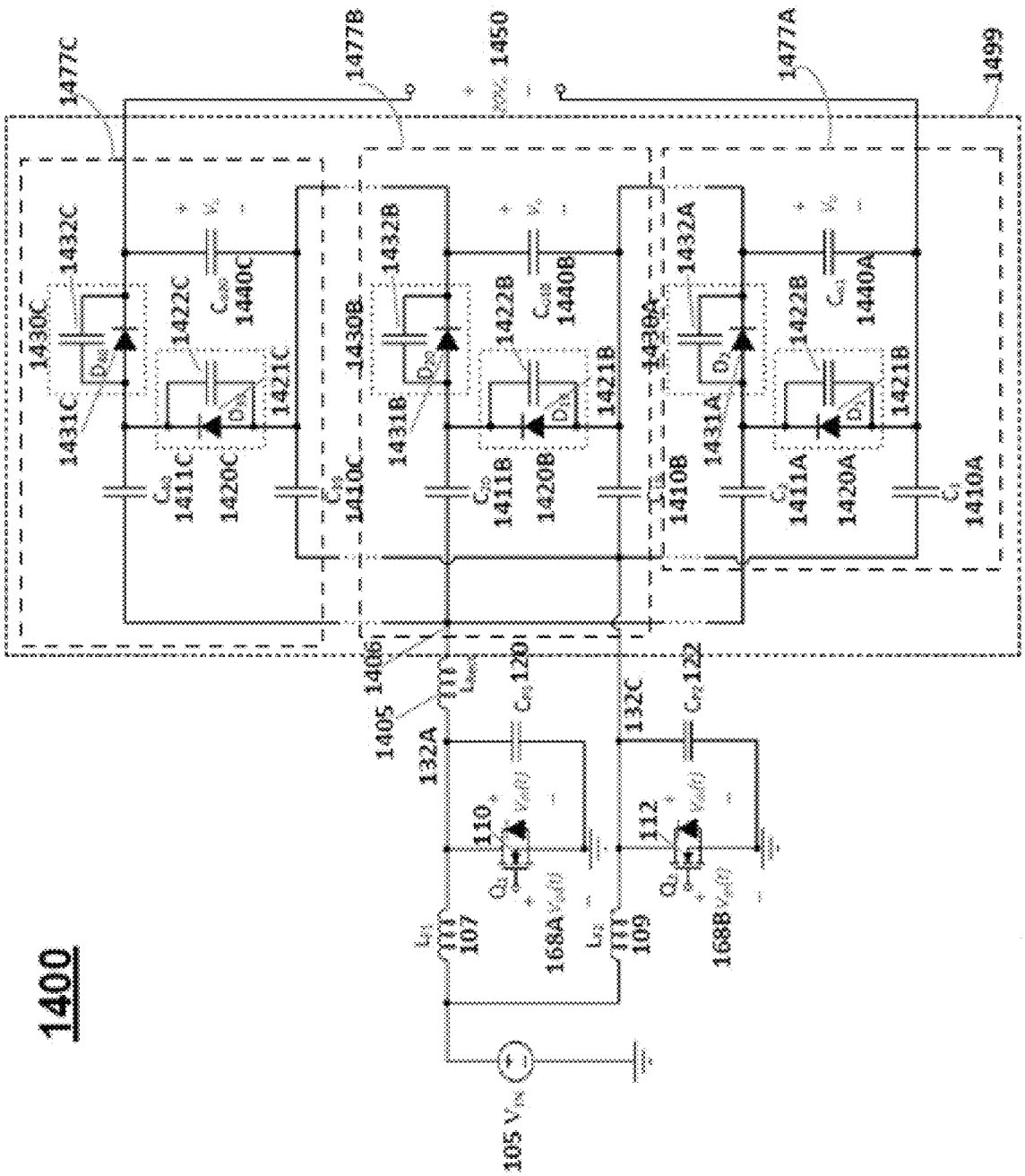
FIG. 14 depicts a detailed circuit diagram of the resonant converter of FIG. 3, in accordance with some example embodiments.

FIG. 14 depicts an example circuit implementation 1400 for the example embodiment shown at FIG. 3. The description of FIG. 14 also refers to FIG. 1 and FIG. 3.

The system 1400 includes the RF amplifier 190 and a rectifier 1499, which may be embedded in a PCB, with dimensions similar to a credit card (e.g., about 86 mm long and 54 mm wide as shown at FIG. 3).

Although different types of rectifiers can be used to rectify the sinusoidal AC output of the circuit 190 into DC, an example of a rectifier can be found at U.S. application Ser. No. 15/199,326, entitled "Isolated multi-level resonant topologies for wide-range power conversion and impedance matching," to Luke Raymond et al., which is incorporated by reference herein in its entirety.

The system 1400 may include a RF resonant amplifier circuit 190 coupled to rectifier 1499 for the purposes of achieving DC-DC conversion. One output of RF amplifier 190 may be connected to rectifier 1499 at 132A (as to include inductor 1405) and the other output of 190 may be connected to rectifier 1499 at 132C.

Rectifier circuit 1499 may appear capacitive at inputs 1406 and 132C. The inductor 1405 may be chosen to resonate with the capacitance to allow for the combination of rectifier 1499 and inductor 1405 to appear resistive at RF amplifier 190 connection points 132A and 132C. Inductor 1405 may be omitted at lower frequencies (below approximately 5 MHz, for example). Rectifier 1499 may be coupled to the output load at 1450.

The circuit 1499 may include multiple units 1477A-C, each comprising a pair of series capacitors (e.g., 1410A and 1411A) and a pair of diodes (e.g., 1421B and 1431A). Each unit includes additional capacitors (e.g., 1422B and 1432A), which represent the intrinsic capacitance of the diodes. Each unit 1477A-C may include a capacitor (e.g., 1440A) to provide output ripple reduction. The series capacitors in each unit (e.g., 1410A and 1411A) may provide DC blocking such that multiple units can be combined with inputs in parallel connected at 1406 and 132C and outputs in series. Because the outputs of each unit 1477A-C are connected in series, the total output voltage at 1450 becomes the sum of the rectified output voltage of each unit (e.g., Vo). Likewise, since the inputs of each rectifier unit are connected in parallel, the input impedance of 1499 measured at 1406 and 132C is equivalent to the input impedance of each unit (e.g., measured at the input node of 1410A and 1411A) divided by the total number of units. This reduction in input impedance allows for higher overall voltage gains to be achieved without the need for an additional passive matching network stage as is commonly required in resonant DC-DC converters. If desired, a passive matching network stage can be included between 109 and 1499 to achieve even higher gains. Although FIG. 14 shows three stages at units 1477A-C, other quantiles of units 1477A-C can be implemented and combined at the output at 1450. Moreover, although FIG. 14 depicts circuit 190, other circuits such as 191-194 may be used as well.

Figure 15:
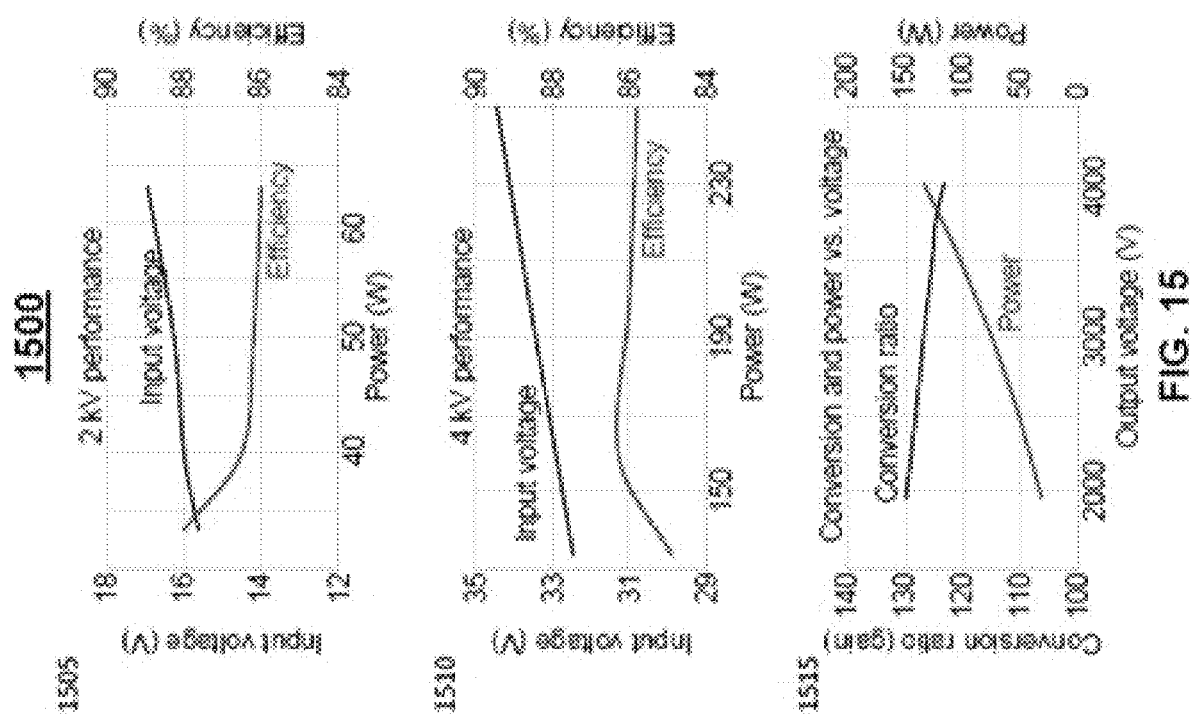
FIG. 15 depicts performance characteristics of the resonant converter of FIG. 3, in accordance with some example embodiments.

FIG. 15 depicts plots of examples of performance results. The results in this example correspond to the apparatus 300 of FIG. 3 (and the corresponding circuit 1400). The results show efficiency for a range of input voltages and powers for 2 kilovolt, 4-kilovolt operations. At 2 kV 1505, the efficiency may be above 86% for operations in the 35-65 Watt range and an input voltage between about 12-18 volts. At 4 kV 1510, the efficiency may be above 85% for operations in the 130-250 Watt range and an input voltage between about 32-35 volts. At 1515, the plot shows conversion ratio and power versus voltage for the apparatus 300 of FIG. 3. Although FIG. 15 depicts examples of performance results, these are examples, so results may vary depending on the implementation.

Figure 16:
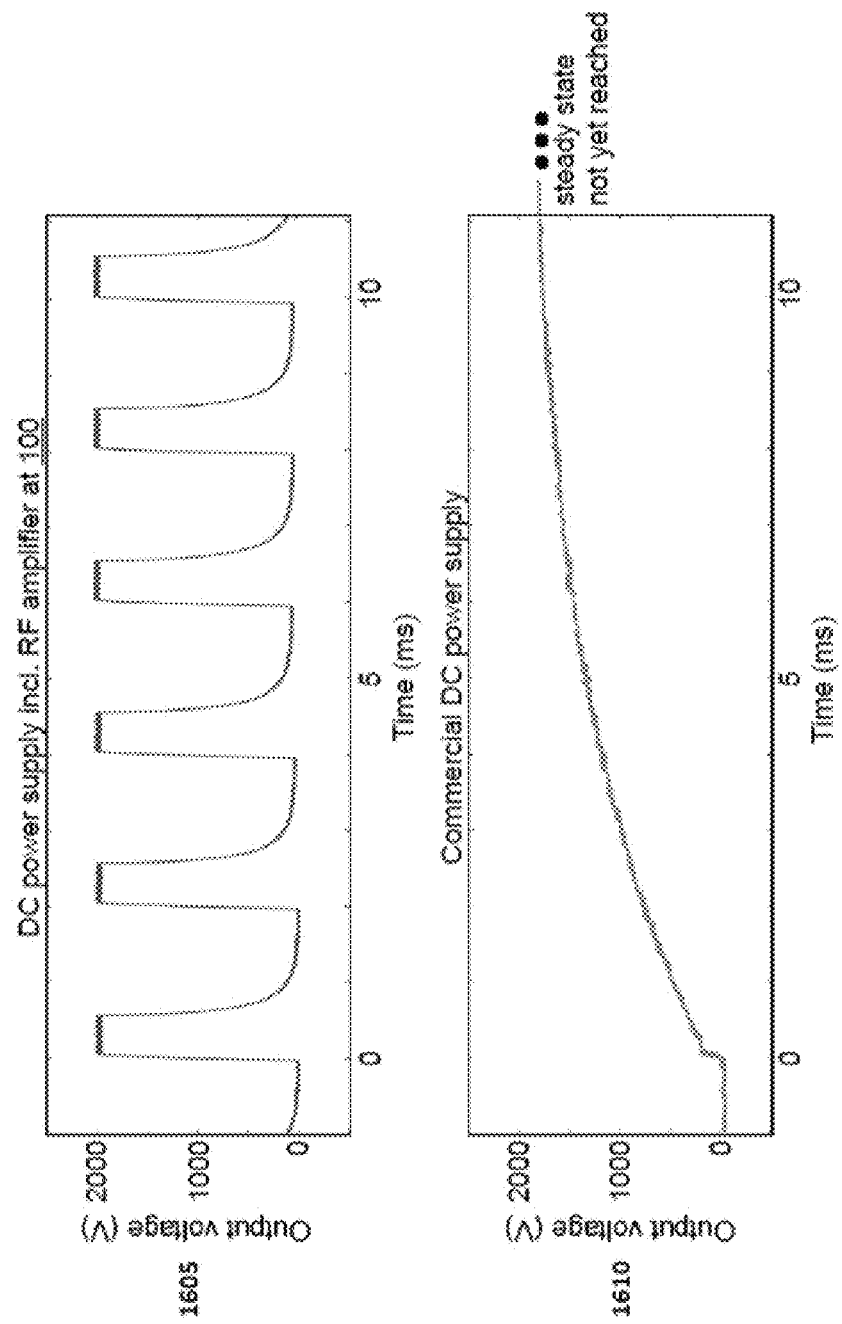
FIG. 16 depicts rise time performance characteristics of the resonant DC-DC converter of FIG. 3 as compared with a prior product, in accordance with some example embodiments.

FIG. 16 depicts a plot showing how much faster of a transient response can be achieved in accordance with some of the circuits such as circuit 1400 of FIG. 14 disclosed herein, when compared to a prior high voltage supply of comparable specifications with respect to input voltage, output voltage, and power. The plot at 1605 demonstrates how quickly circuit 1400 responds when turned on and off at 1 ms intervals (1 ms on followed by 1 ms off), reaching its full output voltage set point of 2 kV in fractions of 1 ms. 1610 depicts the turn on transient time of the output voltage associated with a commercially available high voltage power supply of similar ratings. Although FIG. 16 depicts examples of performance results, these are examples, so results may vary depending on the implementation.

Figure 17:
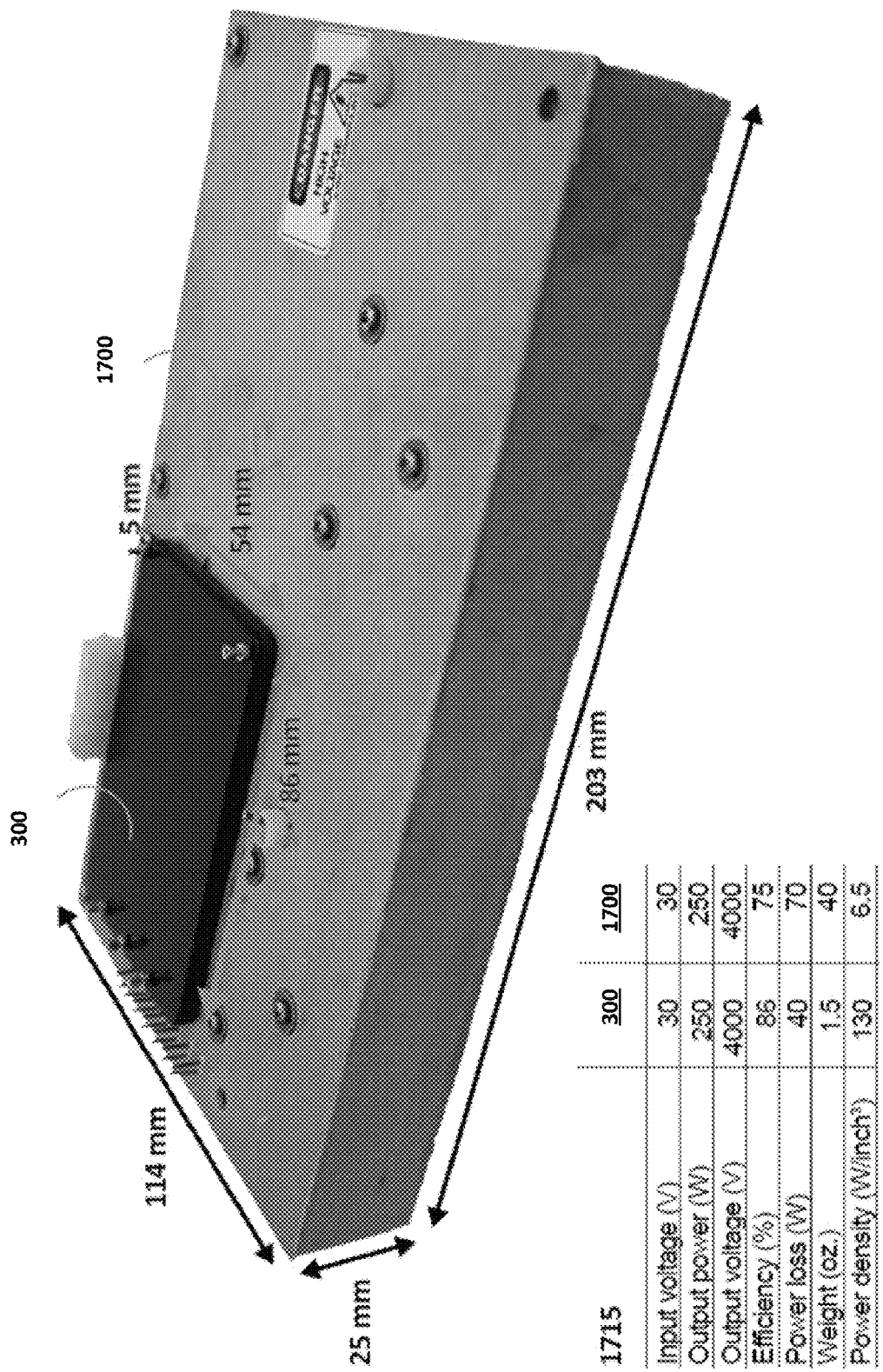
FIG. 17 depicts an example implementation of the resonant DC-DC converter of FIG. 3 as compared with a prior product, in accordance with some example embodiments.

FIG. 17 depicts a physical comparison between an example implementation, such as apparatus 300 (FIG. 3) and a comparable (with respect to power and voltage rating), prior power amplifier 1700. The apparatus 300 exhibited 47% lower loss (40 W vs 70 W), when compared to the prior amplifier 1700. And, the apparatus 300 may be about 20 times smaller, when compared to the prior amplifier 1700. Because the apparatus 300 of FIG. 3 operates at much higher frequency than prior amplifier 1700, the internal energy storage of the apparatus 300 may be much lower due to smaller passive components. Although FIG. 17 depicts examples of performance results, these are examples, so results may vary depending on the implementation.

Figure 18:
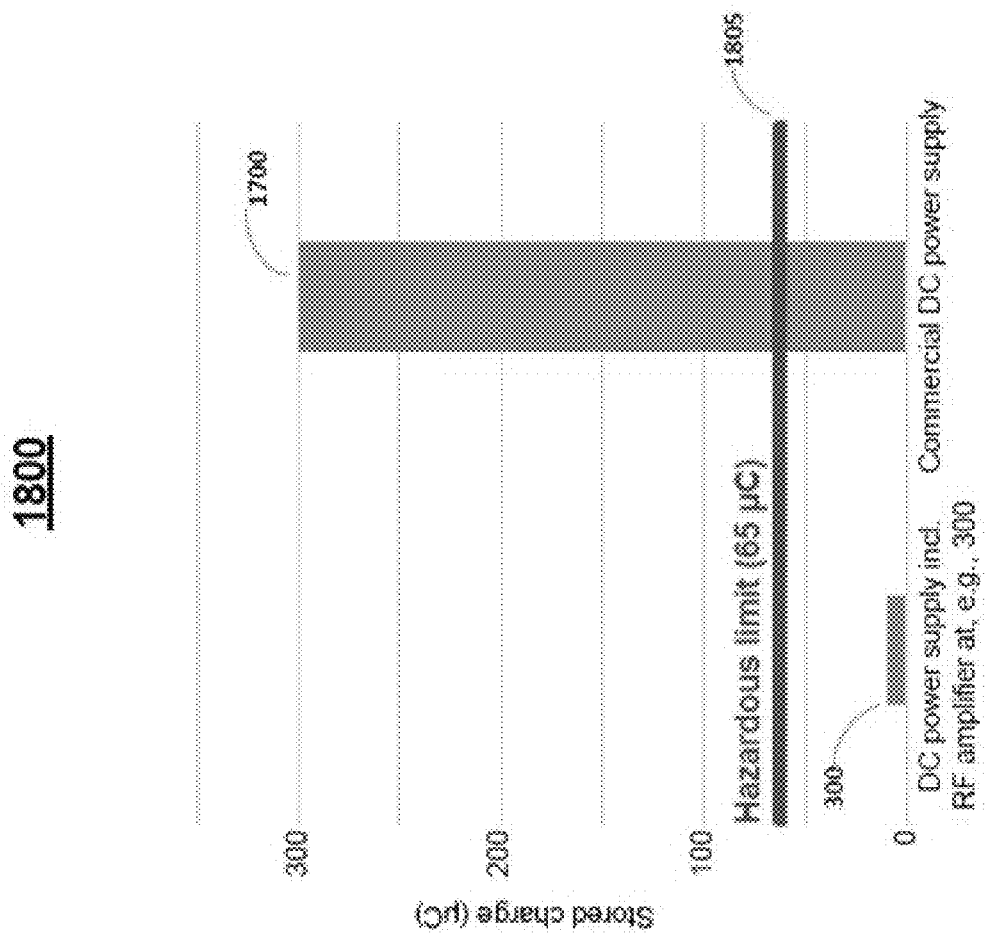
FIG. 18 depicts electrical attributes of the resonant DC-DC converter of FIG. 17 as compared with a prior product, in accordance with some example embodiments.

FIG. 18 provides a plot 1800 comparing the charge stored within the two power amplifiers 300 and 1700 (FIG. 17). While the prior power amplifier 1700 has a stored charge that exceeds the hazardous limit 1805 outlined in standard IEC 61010-1, the apparatus 300 falls below the limit 1805 indicating a safer design with respect to IEC 61010-1. Although FIG. 18 depicts examples of performance results, these are examples, so results may vary depending on the implementation.

Figure 19:
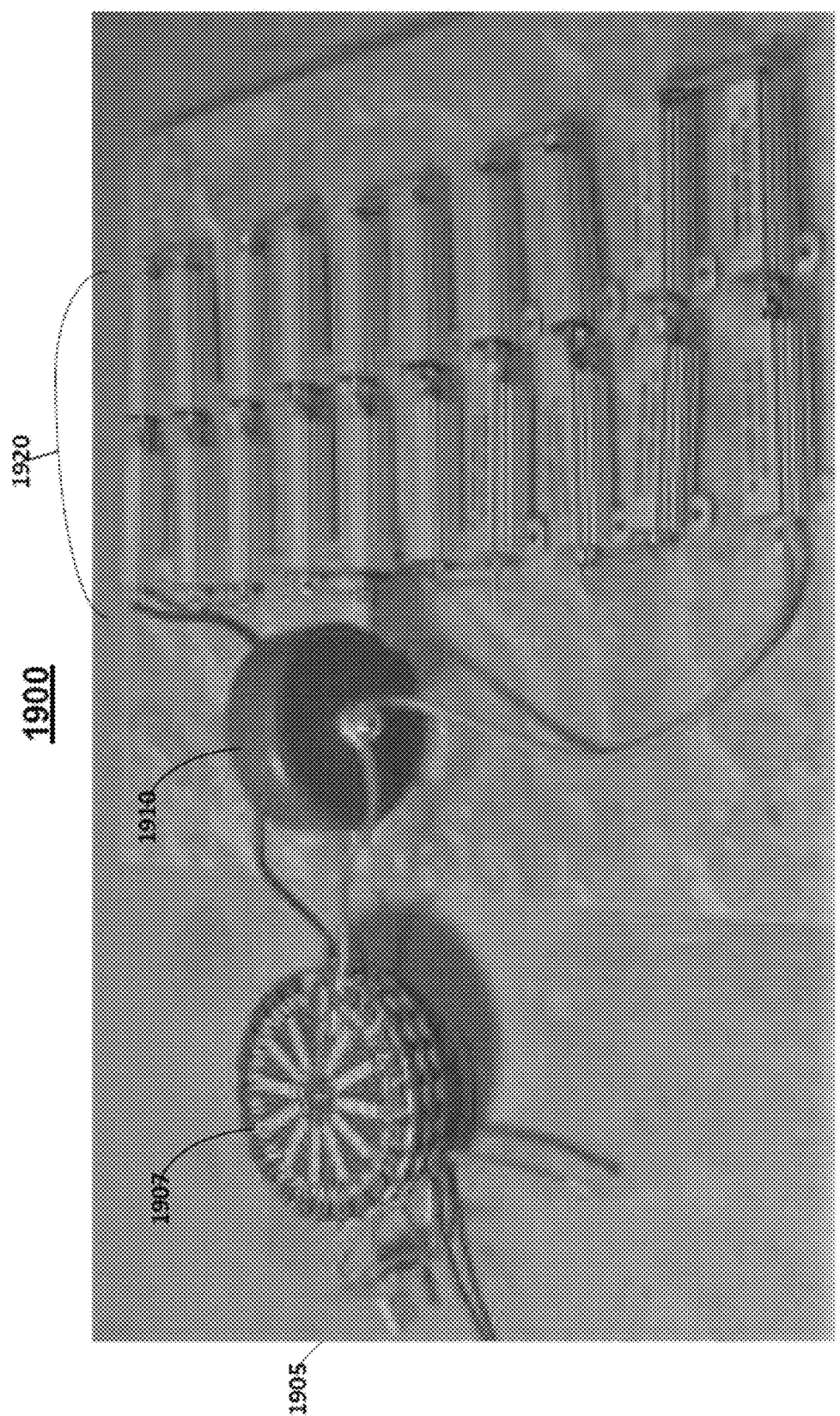
FIG. 19 depicts another example implementation of the circuit of FIG. 13, in accordance with some example embodiments.

FIG. 19 depicts an example implementation of a system 1300 with a switching frequency of 13.56 MHz, in accordance with some example embodiments. The system 1900 is an example of system 1300. The system 1900 includes gating signal generator 1905, multi-stage rectifier 1907, rectifier output capacitor 1910, and resistive dummy load 1920. In the implementation of FIG. 19, the matching network, such as matching network 1305, is not implemented, although the matching network can be included as shown at FIG. 13. In the example of FIG. 19, the resonant rectifier module 1907, corresponding to the multi-stage resonant rectifier module 1310, includes 33 stages for a DC-DC conversion of 75 volts to 15 kV at an output power of 500 W. The DC-RF efficiency in the example of FIG. 19 was measured to be about 93% on an RF load cell, and the DC-DC efficiency was about 87%.

Figure 20:
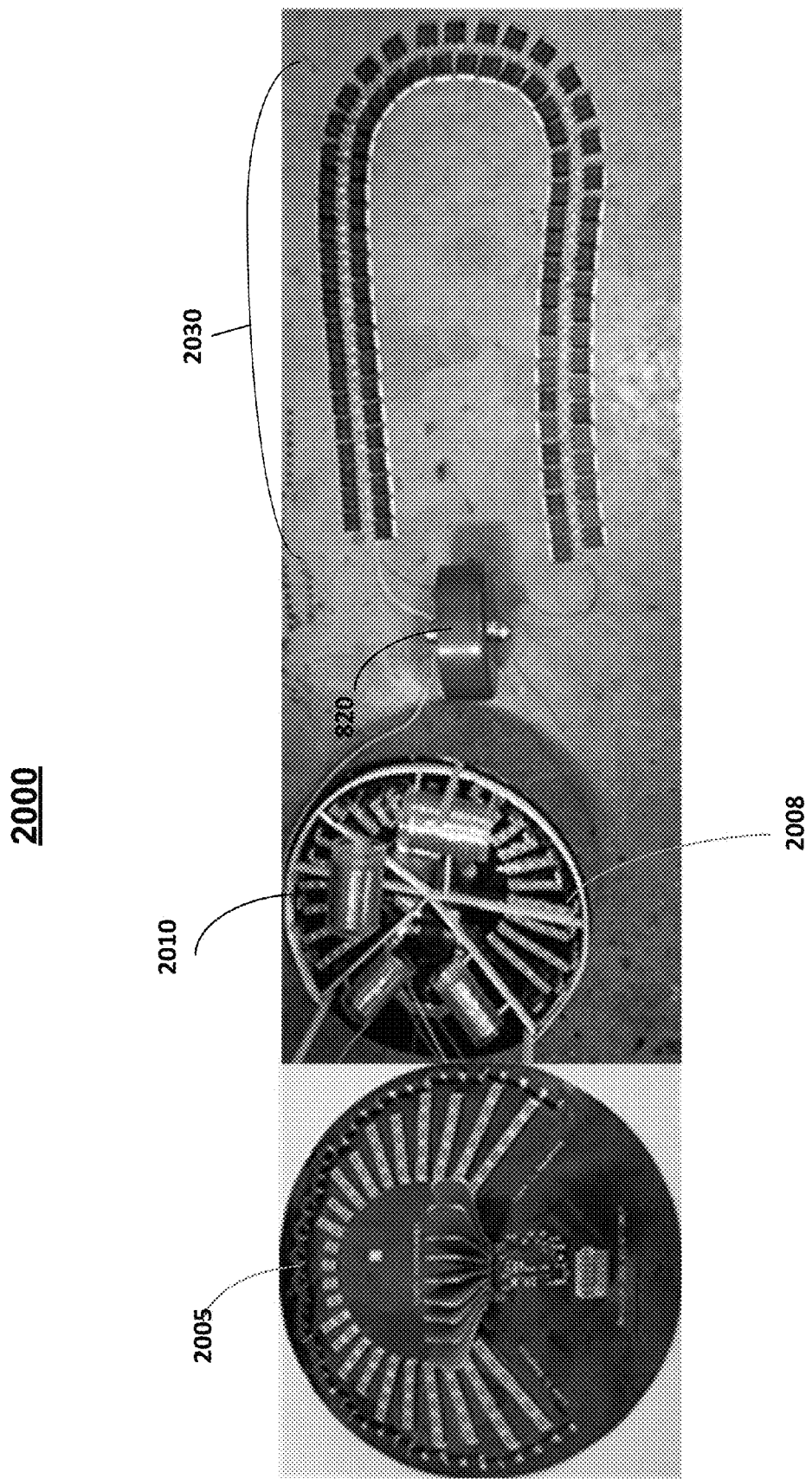
FIG. 20 depicts another example implementation of the circuit of FIG. 13, in accordance with some example embodiments.

FIG. 20 depicts another example implementation of a system 2000, in accordance with some example embodiments. The system 2000 includes a single inverter and 24 rectifier stages on the front side 2005. The other side 2008 shows the inverter, rectifier, and matching inductors 2010. The values are 3.3 nF for the rectifier output capacitor 2020, and 8.9 mega-Ohm for the resistive load 2030. Here, the matching network is included to provide additional voltage gain to the 24-stage rectifier portion while still appearing resistive at its input. The DC-DC converter was designed to convert 120 volts DC to 50 kilovolts DC at a peak power of 2 kilowatts. It has been successfully tested up to 40 kilovolts.

The RF amplifier circuits described herein may be used in a variety of technology applications including high power RF applications. Examples of high power RF applications include plasma generation for many different applications, and high power radio amplifiers. The RF amplifier circuits described herein may also be coupled to other circuits, such as matching networks, rectifiers, and/or the like to enable high performance and compact high voltage DC power supplies. The RF amplifier circuits described herein may also be implemented in inductive and/or capacitive heating or surface treatments; near/far field wireless power transfer; ion and electron acceleration (whereby one or multiple electrodes are driven by the RF amplifier to create electric fields that accelerate the ions or electrodes as they traverse the accelerator); ion generation within focused ion beam equipment; and/or satellite propulsion units.

The RF amplifier circuits described herein may be also be used in high voltage DC applications where increased efficiency, low cost, and/or small size and weight may be desired including: ion propulsion of aerial vehicles (e.g., "ion wind drones") that can boast superior thrust-to-energy performance (compared to propellers); silent operation, low radar and infrared profiles; fast and more agile control; and long operation with vertical take-off and landing.

The RF amplifier circuits described herein may be also be used in electrostatic precipitators, especially in mobile applications where size is important, or in regulated areas of commerce, such as the automotive and shipping industries, where emissions requirements necessitates high efficiency of particulate reduction.

Moreover, the RF amplifier circuits described herein may be also be used in electrostatic adhesion, especially in agile robotic systems where the power supply can be incorporated into the lifting module and where the fast transient response gives benefit to handling control and feedback capabilities.

In addition, the RF amplifier circuits described herein may be also be used in electrostatic adhesion for semiconductor wafer chucks.

Further, the RF amplifier circuits described herein may also be used for driving high-voltage equipment, such as electro-optic deflectors, electro-optics modulators, pockels cells, travelling wave tubes (TWTs) and radar equipment; driving E-beam and ion beam equipment, where high voltages are used to accelerate and control the ions or electrons; X-ray generation; and/or satellite propulsion by means of combined RF and high voltage ion acceleration.

The RF amplifier circuits described herein may use a high frequency which enables fast turn-on and turn-off times. This in turn may enable fast pulsing with several applications. For example, the RF amplifier circuits described herein may also be used to provide pulsed field sterilization of water, milk, or other liquids. The liquid is exposed to pulses of high electric fields as they pass through a tube with adjacent electrodes. The fields lyse bacterial cells and can reduce the bacterial load by several orders of magnitude, limiting the potential for disease or spoiling of milk or other liquid substances. Likewise, the RF amplifier circuits described herein is may also be used in pulsed field in medical applications, whereby cells, such as cancer cells, are selectively destroyed within a human or animal subject.

The pulsing may also be combined into the electrostatic precipitator described above to increase the precipitation efficiency without risking breakdown of the electric field. When combining a compact DC power supply, based on the RF amplifier described herein, with a pulser unit capable of delivering ns-scale pulses, several applications may be provided. For example, the combination may provide for the generation of cold atmospheric plasmas, such as Nanosecond Repetitively Pulsed plasmas. These plasmas can be created directly from air at ambient conditions without significant heating of the air. It can also be used with a range of gases, including helium, argon, and nitrogen, to increase the plasma density and lower the temperature, compared with RF sources with similar power requirements. Likewise, the sterilization of wounds and stimulation of wound healing by application of cold plasma onto affected wound sites in patients may be provided. And, the sterilization of surfaces or equipment may be provided.

Plasma-assisted deposition of biomaterials or other sensitive materials that break down at high temperatures may also be provided. This includes delivery onto human skin or wounds of antibiotics, growth factors, chitosan, collagen, or other compounds that sterilize wounds or promote wound healing.

Plasma-assisted combustion that uses the free radicals in the plasma to increase combustion efficiency or that stabilizes combustion flames to allow for more lean operation may also be provided. This includes improved performance of airplane jet engines, car engines, and power plants.

Plasma-assisted flow control of airplanes or other vehicles may also be provided (whereby the flow of air or other gases is controlled by plasma generated on or in proximity of parts on the surface of the vehicle).

The noted nanosecond pulses may be applied to selective destruction of tissue in humans or animals.

Plasma chemistry may also be provided, whereby useful chemical species are created in gas, liquids, or at gas-liquid interfaces, or destroyed, with the help of the high electric fields and the plasma generated by the fields. Examples include fertilizer generation from air at a water-air interface, ozone generation in air, and degradation of $CO_2$.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." Use of the term "based on," above and in the claims is intended to mean, "based at least in part on," such that an unrecited feature or element is also permissible.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and subcombinations of the disclosed features and/or combinations and subcombinations of several further features disclosed above. In addition, the logic flows depicted in the accompanying figures and/or described herein do not necessarily require the particular order shown, or sequential order, to achieve desirable results. Other implementations may be within the scope of the following claims.

What is claimed is:

1. A resonant amplifier circuit comprising:
    a first inductor having a first inductive input and a first inductive output;
    a second inductor having a second inductive input and a second inductive output, wherein the second inductor is separate from the first inductor, wherein the first inductive input of the first inductor and the second inductive input of the second inductor are directly coupled to a first power terminal of a direct current power source;
    a first switch coupled, via a first terminal of the first switch, to the first inductive output; and
    a second switch coupled, via a second terminal of the second switch, to the second inductive output, wherein the first switch and the second switches are driven out of phase based at least in part on a clock signal, wherein the first inductor is configured to be resonant with a first capacitance coupled across the first terminal of the first switch and a second terminal of the first switch, and wherein the second inductor is configured to be resonant with a second capacitance coupled across a first terminal of the second switch and the second terminal of the second switch; and
    a load matching circuit coupled to the first inductive output and the second inductive output, and wherein the load matching circuit is further coupled to at least one blocking capacitor,
    wherein a second power terminal of the direct current power source is coupled to the second terminal of the first switch, the first terminal of the second switch, a first terminal of the first capacitance, and a first terminal of the second capacitance, and
    wherein the first inductive output of the first inductor is coupled to the first terminal of the first switch and a second terminal of the first capacitance, and wherein the second inductive output of the second inductor is coupled to the second terminal of the second switch and a second terminal of the second capacitance.

2. The resonant amplifier circuit of claim 1, wherein the first power terminal is a positive polarity terminal and the second power terminal is negative polarity terminal, and wherein the first terminal of the first switch corresponds to a drain terminal of the first switch, the second terminal of the first switch corresponds to a source terminal of the first switch, wherein the first terminal of the second switch corresponds to a source terminal of the second switch, and wherein the second terminal of the second switch corresponds to a drain terminal of the second switch.

3. The resonant amplifier circuit of claim 1, wherein the first capacitance includes a first external capacitance and an intrinsic capacitance of the first switch itself, and wherein the second capacitance includes a second external capacitance and an intrinsic capacitance of the second switch itself.

4. The resonant amplifier circuit of claim 3, wherein the intrinsic capacitance is a drain-to-source capacitance for the first switch and a gate-to-drain capacitance for the first switch.

5. The resonant amplifier circuit of claim 1, wherein the first switch and the second switch each comprise a field-effect transistor.

6. The resonant amplifier circuit of claim 1, wherein the first switch and the second switch each comprise a high-electron-mobility transistor (HEMT), a gallium nitride (GaN) HEMT, a gallium arsenide (GaAs) HEMT, a bipolar junction transistor (BJT), an insulated-gate bipolar transistor (IGBT), a junction gate field-effect transistor, a thyristor, a metal-oxide-semiconductor field-effect transistor (MOSFET), a silicon carbide (SiC) (MOSFET), a silicon (Si) (MOSFET), a diode, and/or a silicon-controlled rectifier.

7. The resonant amplifier circuit of claim 1 further comprising:
a load coupled across the first switch and the second switch.

8. The resonant amplifier circuit of claim 7, wherein the load comprises a plurality of loads, and wherein an output of the power source is coupled to at least a portion of the plurality of loads.

9. The resonant amplifier circuit of claim 1, wherein the load matching circuit comprises at least one inductor, at least one capacitor, and/or at least one transformer.

10. The resonant amplifier circuit of claim 1 further comprising:
a rectifier circuit configured to provide a direct current output to a load.

11. The resonant amplifier circuit of claim 1, wherein the at least one blocking capacitor comprises:
a first blocking capacitor having a first blocking input and a first blocking output, and wherein the first blocking input is coupled to at least the first switch and the first blocking output is coupled to the load matching circuit; and/or
a second blocking capacitor having a second blocking input and a second blocking output, and wherein the second blocking input is coupled to at least the second switch and the second blocking output is coupled to the load matching circuit.

12. The resonant amplifier circuit of claim 1, wherein the first inductor and/or the second inductor each comprise a transformer.

13. The resonant amplifier circuit of claim 1, wherein the first switch and the second switches are driven out of phase by 180 degrees based on the clock signal provided to a third terminal of the first switch and a third terminal of the second switch.

14. The resonant amplifier circuit of claim 1, wherein the resonant amplifier circuit comprises an array of resonant amplifier circuits connected in parallel and/or series.

15. The resonant amplifier circuit of claim 1, wherein the first switch comprises a plurality of first switches.

16. The resonant amplifier circuit of claim 15, wherein the plurality of first switches share a common clock configured to turn the plurality of first switches on and/or off at a same time.

17. The resonant amplifier circuit of claim 1, wherein the second switch comprises a plurality of second switches.

18. The resonant amplifier circuit of claim 17, wherein the plurality of second switches share a common clock configured to turn the plurality of second switches on and/or off at a same time.

19. The resonant amplifier circuit of claim 1, wherein the first switch comprises a plurality of first switches, wherein the second switch comprises a plurality of second switches.

20. The resonant amplifier circuit of claim 19, wherein one of the switches of the plurality of first switches and another switch in the plurality of second switches share an interval, wherein during a first portion of the interval the one of the switches of the plurality of first switches is gated to turn on and off and then during a second portion of the interval the other switch in the plurality of second switches is gated to turn on and off.

* * * * *